United States Patent
Kawakami et al.

(10) Patent No.: US 7,167,489 B2
(45) Date of Patent: Jan. 23, 2007

(54) GAN-BASED SEMICONDUCTOR LASER DEVICE

(75) Inventors: Toshiyuki Kawakami, Nara (JP); Yukio Yamasaki, Daito (JP); Tomoki Ono, Pittsburgh, PA (US); Shigetoshi Ito, Ikoma (JP); Susumu Omi, Kitakatsuragi-gun (JP)

(73) Assignee: Sharp Kabushiki Kaisha, Osaka (JP)

( * ) Notice: Subject to any disclaimer, the term of this patent is extended or adjusted under 35 U.S.C. 154(b) by 62 days.

(21) Appl. No.: 10/490,582

(22) PCT Filed: Jul. 18, 2002

(86) PCT No.: PCT/JP02/07332

§ 371 (c)(1),
(2), (4) Date: Mar. 18, 2004

(87) PCT Pub. No.: WO03/030317

PCT Pub. Date: Apr. 10, 2003

(65) Prior Publication Data

US 2004/0245537 A1 Dec. 9, 2004

(30) Foreign Application Priority Data

Sep. 21, 2001 (JP) ............................. 2001-289072
Dec. 7, 2001 (JP) ............................. 2001-373560

(51) Int. Cl.
*H01S 3/098* (2006.01)
*H01S 3/13* (2006.01)
*H01S 5/00* (2006.01)

(52) U.S. Cl. .................. 372/19; 372/29.02; 372/45.01; 372/46.01

(58) Field of Classification Search .............. 372/19, 372/29.02, 45.01, 46.01
See application file for complete search history.

(56) References Cited

U.S. PATENT DOCUMENTS 5,825,052 A 10/1998 Shakuda (Continued)

FOREIGN PATENT DOCUMENTS

JP 08-064869 A 3/1996

(Continued)

OTHER PUBLICATIONS

Nakamura, S. et al. (1997). "InGaN/GaN/AlGaN-Based Laser Diodes with Modulation-Doped Strained-Layer Superlattices," *Jpn J. Appl. Phys.* 36(12):L1568-L1571.

(Continued)

*Primary Examiner*—Minsun Harvey
*Assistant Examiner*—Marcia A. Golub
(74) *Attorney, Agent, or Firm*—Morrison & Foerster LLP

(57) ABSTRACT

According to an aspect of the present invention, a nitride semiconductor laser device includes a nitride semiconductor active layer, and a stripe-shaped waveguide for guiding light generated in the active layer. At least one pair of light-absorbing films are provided in at least local regions on the opposite sides of the stripe-shaped waveguide, to reach a distance within 0.3 μm from the waveguide. According to another aspect of the present invention, a gan-based semiconductor laser device includes first conductivity type semiconductor layers, a semiconductor active layer and second conductivity type semiconductor layers stacked sequentially. The laser device further includes a ridge stripe provided to cause a refractive index difference for confinement of light in a lateral direction crossing a longitudinal direction of a cavity, and a current-introducing window portion provided on the ridge stripe. The current-introducing window portion includes a narrow portion that is locally narrowed compared to the width of the ridge stripe.

5 Claims, 23 Drawing Sheets

U.S. PATENT DOCUMENTS 6,430,204 B1 * 8/2002 Tanaka .................... 372/46.01

FOREIGN PATENT DOCUMENTS

| | | |
|---|---|---|
| JP | 9-36482 | 2/1997 |
| JP | 10-154843 | 6/1998 |
| JP | 2000-223779 | 8/2000 |
| JP | 2000-509913 | 8/2000 |
| JP | 2000-251299 | 9/2000 |
| WO | WO 98/33249 | 7/1998 |

OTHER PUBLICATIONS

Nakamura, S. et al. (1998). "High-Power, Long-Lifetime InGaN/GaN/AlGaN-Based Laser Diodes Grwon on Pure GaN Substrates," *Jpn. J. Appl.Phys.* 37(Part 2, No. 3B):309-312.

Nagahama, S.-I. et al. (2000). "High-Power and Long-Lifetime InGaN Multi-Quantum-Well Laser Diodes Grown on Low-Dislocation-Density GaN Substrates," *Jpn. J. Appl. Phys.* 39(Part 2, No. 7A):L647-L650.

Nakamura, S. et al. (Sep. 2, 1996). "Ridge-Geometry InGaN Multi-Quantum-Well-Structure Laser Diodes," *Appl. Phys. Lett.* 69(10):1477-1479.

* cited by examiner

GAN-BASED SEMICONDUCTOR LASER DEVICE

TECHNICAL FIELD

The present invention relates to improvement of a GaN-based semiconductor laser device that can be used for a light source of optical information equipment or the like.

BACKGROUND ART

It has been tried to use GaN-based semiconductors made of compounds of the III group element(s) such as Al, Ga and In with the V group element of N as semiconductors for light emitting devices or power devices, because of their favorable energy band structures and chemical stability. For example, production of blue semiconductor laser devices by stacking a plurality of GaN-based semiconductor layers on each of sapphire or GaN substrates has been attempted vigorously.

An example of a bluish green semiconductor laser device is shown in FIG. 23 in schematic perspective view, wherein a ridge-type waveguide is formed to cause a refractive index difference in a direction parallel to the semiconductor junction surface, to thereby confine light for lasing (see, e.g., Jpn. J. Appl. Phys., Vol. 37 (1998) pp. L309–L312 and Jpn. J. Appl. Phys., Vol. 39 (2000) pp. L647–L650).

In the GaN-based semiconductor laser 1100 of FIG. 23, a GaN thick film is formed on a (0001) plane sapphire substrate (not shown). After removal of the sapphire substrate, the GaN thick film is used as the (0001) plane GaN substrate 501. Stacked successively on GaN substrate 501 are a GaN buffer layer 502, an n-type GaN contact layer 503, an n-type AlGaN clad layer 504, an n-type GaN guide layer 505, a multiple quantum well active layer 506 utilizing InGaN, a p-type AlGaN evaporation preventing layer 507, a p-type GaN guide layer 508, a p-type AlGaN clad layer 509, and a p-type GaN contact layer 510.

In this semiconductor laser 1100, a ridge stripe 511 is formed with an an upper portion of p-type AlGaN clad layer 509 and p-type GaN contact layer 510. As such, a stripe-shaped waveguide for confinement of a lateral transverse mode is provided by creating the refractive index difference in the direction parallel to the semiconductor junction surface.

A $SiO_2$ dielectric film 513 not absorbing the light from active layer 506 is formed on each side surface of ridge stripe 511 so as to form a current-constricting structure for introducing electric current only from the top surface of the ridge stripe. The refractive index at ridge stripe portion 511 is higher than that at either side thereof, so that a refractive index distribution in a mesa-like shape is created in the direction parallel to the semiconductor junction surface.

A p-side electrode 515 is formed on the top surface of ridge stripe 511 and on the upper surface of $SiO_2$ dielectric film 513. Further, an n-side electrode 517 is deposited on n-type GaN contact layer 503 having been partially exposed by reactive ion etching (RIE). These electrodes serve to introduce the current into semiconductor laser 1100.

In semiconductor laser 1100, mirror facets are formed by dry etching and the light confinement is achieved by the mesa-like refractive index distribution in ridge stripe portion 511, so that it is possible to obtain stable lasing of the lateral transverse mode with a low threshold current. Furthermore, the lifetime of that semiconductor laser exceeds 10,000 hours, and thus it is considered the semiconductor laser technology has almost been completed in terms of the long life and accompanying reliability of the laser.

However, when lasing is kept up to a high optical output region in the laser having the structure as shown in FIG. 23, linearity of the current and optical output (I-L) characteristic may be impaired during the process of increasing the amount of introduced current. It is known that there are cases where the optical output becomes out of proportion to increase of the current, causing a stepped change of the optical output that is called a "kink". Such a kink occurring in a laser device involves a sift in the emitting direction of the laser beam as well as fluctuation of the output, thereby causing critical problems in practical use of the laser. It is considered that the kink has a close relation with stability of the lateral transverse mode. The following are two conceivable reasons for occurrence of the kink.

Firstly, in an $In_xGa_{1-x}N$ ($0 \leq x \leq 1$) crystal that is often used for the active layer of the GaN-based laser, regions having different In composition ratios are liable to be formed, which may cause localization of carriers and hence occurrence of the kink. Secondly, the effective mass of the carriers in the GaN-based material is large, so that localization of the carriers may occur and then it causes the kink. Thus, in order to prevent such occurrence of the kink, the GaN-based semiconductor requires laser design different from that with the other semiconductor materials, in consideration of its particular physical properties.

Generally, to prevent the occurrence of the kink, it is effective to narrow the width of the stripe-shaped waveguide. When the stripe width is narrowed, however, the width of the current path is narrowed as well, which causes increase of the operation voltage and then generation of heat, thereby leading to decrease of the lifetime and reliability of the laser. As such, it is desired to provide a structure ensuring stability of the transverse mode, with the minimum necessity of narrowing the current path.

In view of the foregoing, an object of the present invention is to solve the above-described problems, so as to provide GaN-based laser devices that can suitably be used for optical pickups or the like, with a good yield rate.

DISCLOSURE OF THE INVENTION

A nitride semiconductor laser device according to an aspect of the present invention includes a nitride semiconductor active layer, and a stripe-shaped waveguide that guides light generated in the active layer. At least one pair of light-absorbing films are provided in at least local regions on opposite sides of the stripe-shaped waveguide, to reach a distance within 0.3 µm from the waveguide.

The light-absorbing film preferably has an absorption coefficient of more than $3 \times 10^4$ $cm^{-1}$. Further, the stripe-shaped waveguide has a prescribed cavity length, and the at least one pair of light-absorbing films preferably have a total width within ⅓ of the cavity length along the waveguide.

Further, the nitride semiconductor active layer is preferably formed of $In_xGa_{1-x}N$ ($0 \leq x \leq 1$), and it may contain As or P.

A nitride semiconductor laser device according to another aspect of the present invention also includes a nitride semiconductor active layer, and a stripe-shaped waveguide that guides light generated in the active layer. A portion of the stripe-shaped waveguide in its longitudinal direction constitutes a loss guide type waveguide, and the remaining portion constitutes an effective refractive index guide type waveguide.

According to a further aspect of the present invention, a GaN-based semiconductor laser device having first conductivity type semiconductor layers, a semiconductor active layer and second conductivity type semiconductor layers stacked sequentially, includes a built-in high refractive index region that is provided to cause a refractive index difference for confinement of light in the lateral direction crossing the longitudinal direction of the cavity, and a current-introducing window portion that is provided above the built-in high refractive index region. The current-introducing window portion includes a narrow portion that is locally narrowed compared to a width of the built-in high refractive index region.

It is preferable to provide a ridge stripe to form the built-in high refractive index region, and it is also preferable that the current-introducing window portion includes a narrow portion that is formed on the ridge stripe and is locally narrowed compared to the width of the stripe. A ridge-embedding layer may further be provided to embed the ridge stripe.

The number of the narrow portions in the current-introducing window portion is preferably in a range from 1 to 10. A width W0 of the built-in high refractive index region is preferably in a range of $1\ \mu m \leq W0 \leq 4\ \mu m$. Further, in the current-introducing window portion, the narrow portion has a width W2 and a portion other than the narrow portion has a width W1, preferably satisfying the conditions of $1\ \mu m \leq W1 \leq 4\ \mu m$, $0.3\ \mu m \leq W1-W2 \leq 0.35\ \mu m$, and $0\ \mu m < W2$.

The active layer in the GaN-based semiconductor laser device is preferably formed of $In_xGa_{1-x}N$ ($0 \leq x \leq 1$). Some of N in the active layer may be substituted with As or P.

In forming the GaN-based semiconductor laser device including the current-introducing window portion on the ridge stripe, it is preferable that the ridge stripe is formed after formation of the current-introducing window portion.

BEST MODES FOR CARRYING OUT THE INVENTION

Definitions of Terms

Firstly, there are provide definitions of several terms used in the present specification.

Herein, the "GaN-based semiconductor" refers to a compound semiconductor of a hexagonal crystal system including a compound of the III group element(s) with N of the V group element.

The "stripe-shaped light waveguide" refers to a structure for confining and guiding light generated in a light-generating portion.

The "width" of a ridge stripe refers to a width at the bottom portion of the ridge stripe. The bottom portion of the ridge stripe corresponds to the side from which the semiconductor layers begin to be deposited. Similarly, the "width" of a light-absorbing film refers to a width at the bottom portion of the light-absorbing film. The bottom portion of the light-absorbing film also corresponds to the side from which the film begins to be deposited. The widths are so defined, since the ridge stripe and the light-absorbing film may have their bottom and top portions different in width depending on process conditions.

First Embodiment

Figure 23:
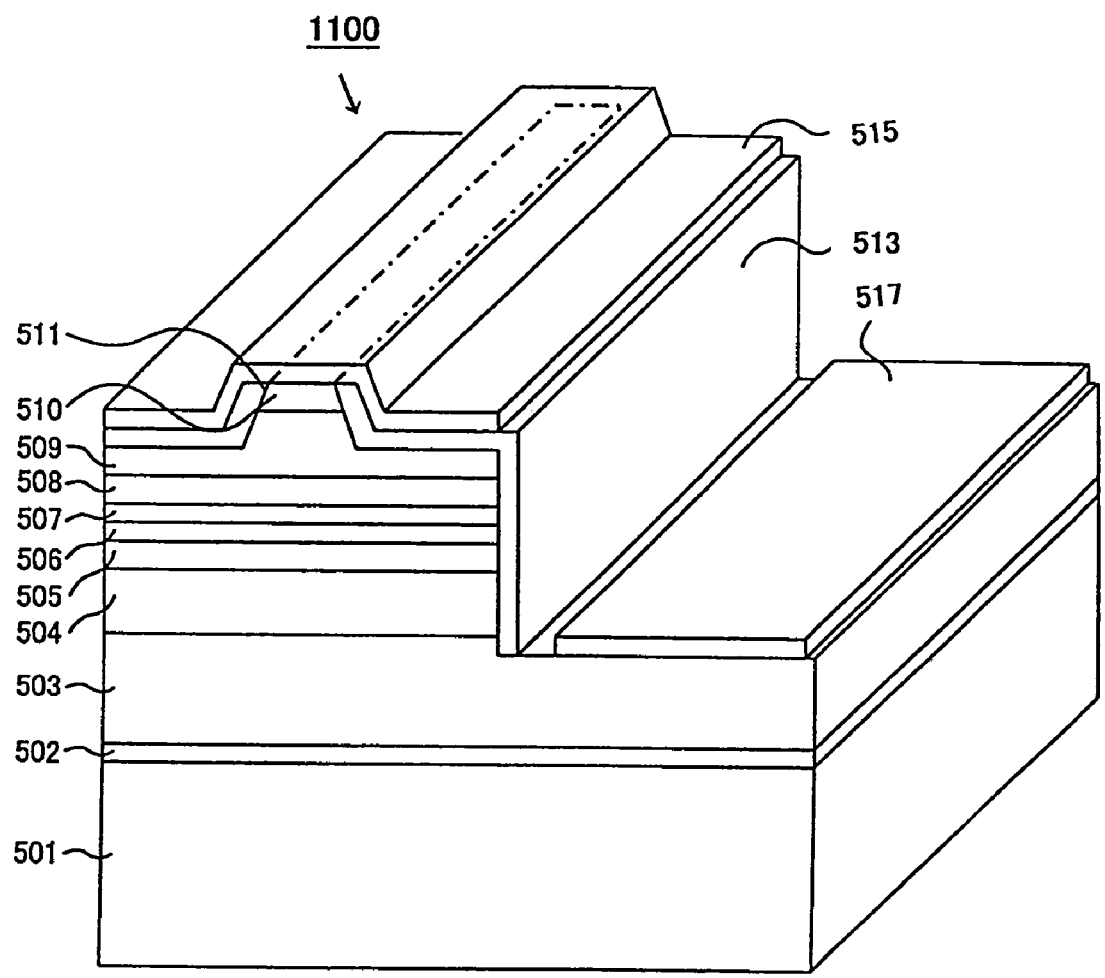
FIG. 23 is a perspective view of a conventional GaN-based semiconductor laser device.

Firstly, the inventors studied the degree of seriousness of the problems suffered in the conventional laser device of FIG. 23. The inventors produced laser devices each having a structure similar to that of FIG. 23, and kept their lasing up to the high optical output region. As a result, the kinks occurred in 50% to 60% of the laser devices with the optical output in a range of 0 mW to 40 mW. For example, a GaN-based semiconductor laser is applied to a light source for an optical information recording apparatus, in which case an optical output of some mW to 40 mW is required. It has thus been found that it is necessary to improve the yield of the devices that do not suffer kinks in the optical output range of lower than 40 mW.

Hereinafter, the first embodiment of the present invention based on the above-described investigation is described with reference to the drawings. Throughout the drawings, the same reference numbers denote the same or corresponding portions.

Figure 1:
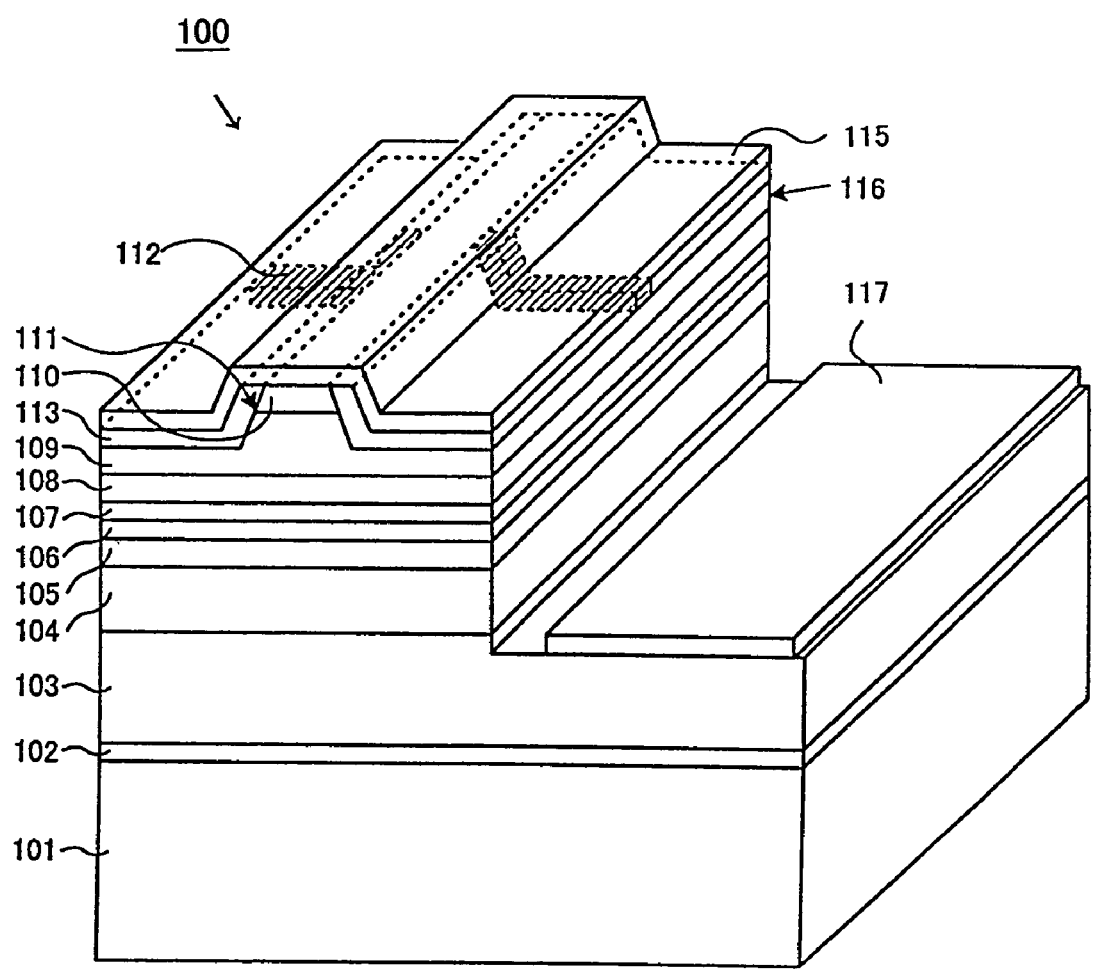
FIG. 1 is a schematic perspective view of a GaN-based semiconductor laser device according to a first embodiment of the present invention.
Figure 2:
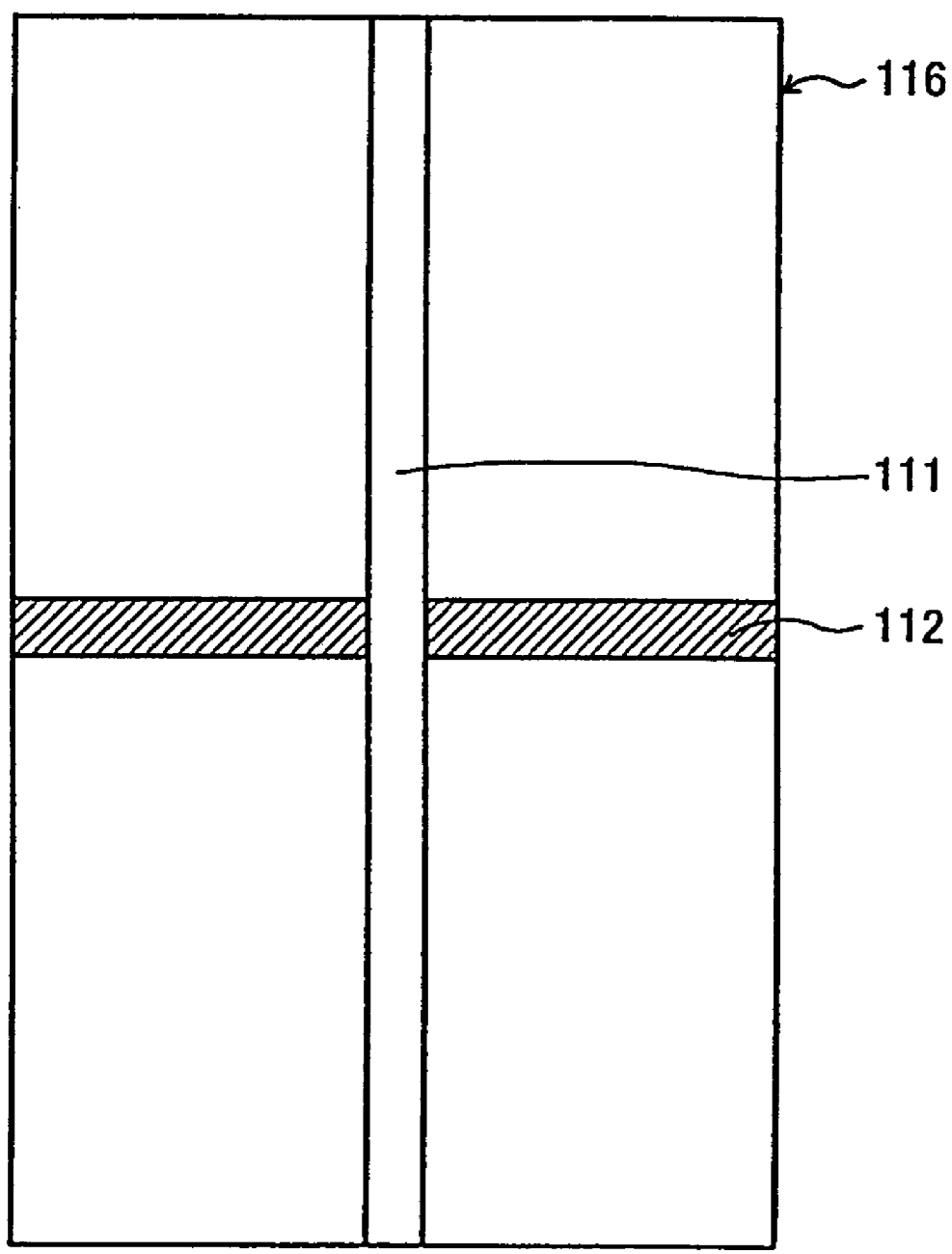
FIG. 2 is a schematic plan view corresponding to the GaN-based semiconductor laser device of FIG. 1.
Figure 3:
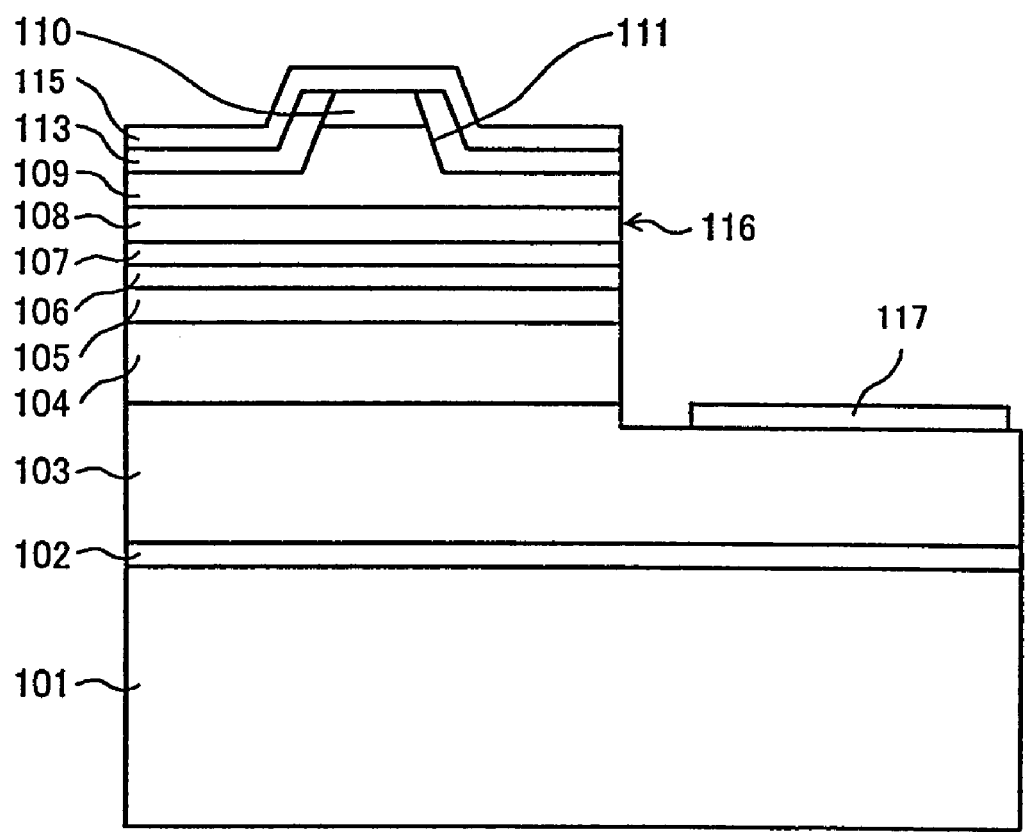
FIG. 3 is a schematic cross sectional view of the GaN-based semiconductor laser device of FIG. 1, taken at a region not including a light-absorbing film.
Figure 4:
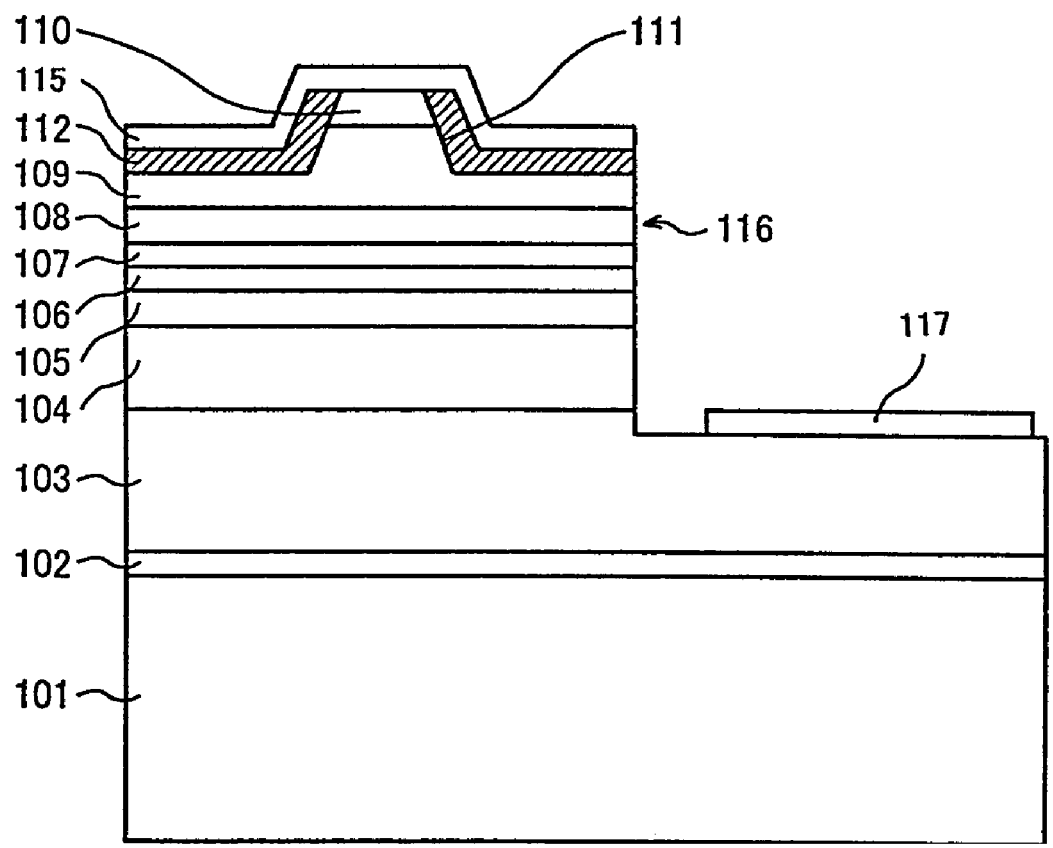
FIG. 4 is a schematic cross sectional view of the GaN-based semiconductor laser device of FIG. 1, taken at a region including the light-absorbing films.

A GaN-based semiconductor laser according to the first embodiment is schematically shown in perspective view of FIG. 1, in plan view of FIG. 2, and in cross sectional views of FIGS. 3 and 4. In forming the laser device of the first embodiment, firstly, a 400 μm-thick sapphire substrate 101 having a (0001) main surface for crystal growth is rinsed, which is followed by high-temperature cleaning at about 1100° C. in a hydrogen ($H_2$) atmosphere within a reactive chamber of a MOCVD (metallorganic chemical vapor deposition) apparatus. After the substrate temperature is lowered to about 550° C., $H_2$ of a carrier gas, silane ($SiH_4$), ammonia ($NH_3$), and trimethyl gallium (TMG) are introduced into the reactive chamber to grow an n-type GaN buffer layer 102 to a thickness of 25 nm.

Next, TMG and $SiH_4$ are introduced to grow an n-type GaN contact layer 103 to a thickness of 4 μm at about 1075° C. Subsequently, TMG and trimethyl aluminum (TMA) are introduced in a prescribed ratio to form an n-type $Al_{0.1}Ga_{0.9}N$ layer 104 to a thickness of 0.95 μm. Thereafter, with the supply of TMA stopped, TMG is introduced to grow an n-type GaN guide layer 105 to a thickness of 100 nm.

The supply of TMG is then stopped, and the carrier gas is changed from $H_2$ to $N_2$. At the substrate temperature lowered to 730° C., trimethyl indium (TMI) and TMG are introduced to grow a barrier layer of $In_vGa_{1-v}N$ ($0 \leq v \leq 1$). Thereafter, the supply of TMI is increased to a prescribed ratio to grow a well layer of $In_wGa_{1-w}N$ ($0 \leq w \leq 1$). These steps are repeated to form a multiple quantum well active layer 106 having an alternately stacked-layered structure of InGaN barrier layers and InGaN well layers (barrier layer/well layer/ . . . well layer/barrier layer). The composition ratios and thicknesses of the InGaN films constituting the barrier and well layers are designed to obtain an emission wavelength in a range of 370–430 nm, and three well layers may be provided for example.

After formation of multiple quantum well active layer 106, the supply of TMI and TMG is stopped, and the substrate temperature is raised again to 1075° C. The carrier gas is changed from $N_2$ back to $H_2$, and then TMG, TMA, and a p-type dopant of bis-cyclopentadienyl magnesium ($Cp_2Mg$) are introduced to grow a p-type $Al_{0.2}Ga_{0.8}N$ evaporation preventing layer 107 to a thickness of 18 nm. Next, with the supply of TMA stopped, the supply amount of TMG is adjusted to grow a p-type GaN light guide layer 108 to a thickness of 100 nm. Thereafter, with TMA introduced in a prescribed ratio, the flow rate of TMG is adjusted to form a p-type $Al_{10}Ga_{0.9}N$ clad layer 109 to a thickness of 0.5 μm.

Thereafter, with the supply of TMA stopped, the supply amount of TMG is adjusted to grow a p-type GaN contact layer 110 to a thickness of 0.1 μm. After completion of the growth, the supply of TMG and $Cp_2Mg$ is stopped, and the substrate is cooled to a room temperature. The obtained wafer is taken out of the MOCVD apparatus.

Subsequently, the wafer having the layers thus grown thereon is processed into laser devices. Firstly, before forming a p-side electrode portion, a stripe-shaped resist pattern having a width of 2 μm is formed, and reactive ion etching (RIE) is conducted to form a ridge stripe portion 111. Although ridge stripe 111 shown in FIG. 1 is tapered in the thickness direction, such a taper is of course not requisite. Thereafter, another resist pattern is used for evaporation of Si to form a pair of light-absorbing films 112 opposite to each other and in contact with the respective sides of ridge stripe portion 111. The width of each light-absorbing film 112 is set to 4 μm in the longitudinal direction of the ridge stripe. The configurations of ridge stripe portion 111 and light-absorbing films 112 will be described later in more detail.

After removal of the resist, a dielectric film 113 to be used for constricting electric current is formed by evaporation of $SiO_2$. Next, p-type GaN contact layer 110 is exposed, and then Pd, Mo and Au are deposited in this order by evaporation to thereby form a p-side electrode 115. As an alternative material having the similar effect to that of the $SiO_2$ dielectric film, it is possible to use a material such as $TiO_2$, zirconia, $Ta_2O_5$, or $Al_2O_3$ having high electric resistance, or a semiconductor of a conductivity type opposite to that of the GaN-based semiconductor layer in contact therewith. As the materials for the p-side electrode, Pd/Pt/Au, Pd/Au, or Ni/Au may be employed alternatively.

Next, after a protective film is formed using a resist, dry etching is conducted to form a mesa 116, partially exposing n-type GaN contact layer 103. On the exposed portion, Ti and Al are deposited in this order by evaporation to thereby form an n-side electrode 117. As the materials for the n-side electrode, Hf/Al, Ti/Mo, or Hf/Au may be employed alternatively.

The wafer processed up to formation of the n-side electrode is divided into bars by pseudo-cleavage to form mirror facets. At this stage, the cavity length is set to 550 μm. The bar is then divided by dicing into laser devices.

A laser device obtained through the above-described process is shown in FIG. 1 in schematic perspective view. In this drawing, the portions delimited by dotted lines represent dielectric film 113 and light-absorbing film 112 hidden beneath p-side electrode 115. FIG. 2 is a plan view of the laser device 100 shown in FIG. 1. In FIG. 2, only a portion corresponding to mesa portion 116 is shown, with the adjacent regions not shown. Further, p-side electrode 115 is not shown, to make the device structure easily understandable. FIG. 3 shows a cross section of the device, which does not include light-absorbing film 112, and FIG. 4 shows a cross section of the device, which includes light-absorbing film 112. Although light-absorbing film 112 inserted between p-side electrode 115 and p-type AlGaN clad layer 109 is formed of a single layer in FIG. 4, it may have a multi-layered structure. Further, for the purpose of facilitating the fabrication method, dielectric film 113 may be formed to cover the top of light-absorbing film 112, in which case also the similar effect can be enjoyed.

Hereinafter, the configurations of the ridge stripe portion and the light-absorbing film in laser device 100 of the first embodiment are described in detail. Ridge stripe portion 111 having a width of 2 μm is formed at the upper portion of GaN-based laser device 100. A pair of light-absorbing layers 112, each having a width of 4 μm, are formed in contact with the respective sides of ridge stripe 111, in a position at equal distances from the mirror facets on the light-emitting side and on the light-reflecting side, to thereby stabilize the transverse mode. The position of light-absorbing layer 112 is not restricted to the equal distances from the mirror facets on the light-emitting side and on the light-reflecting side. However, light-absorbing layer 112 needs to be formed to reach a position within 0.3 μm from the waveguide. If light-absorbing layer 112 is located more than 0.3 μm away from the waveguide, when the laser is designed to have sufficiently large light confining efficiency within the waveguide, the light-absorbing layer barely absorbs the light of higher order modes, in which case the effects of the present invention cannot be brought about.

When the cavity length of the GaN-based laser device is set to L, the width of light-absorbing layer 112 is designed not to exceed L/3. As a result, a portion of the waveguide becomes of a loss guide type, and the remaining portion becomes of an effective refractive index type. If that width is wider than L/3, the lasing threshold current will increase adversely. Particularly, in the case of a loss guide type having the light-absorbing layer with a width of L, the lasing threshold will increase and the slope efficiency will be degraded, disadvantageously for increasing optical output of the laser.

As a material for the light-absorbing layer, one having an absorption coefficient of greater than $3\times10^4$ cm$^{-1}$ with respect to the lasing wavelength of the GaN-based semiconductor laser device may be selected from metals, semiconductors, oxides, nitrides, intermetallic compounds, and the like. If the absorption coefficient is smaller than $3\times10^4$ cm$^{-1}$, it is necessary to increase the width of the light-absorbing layer for stabilizing the transverse mode, which would adversely affect the lasing threshold of the laser. When a good conductor such as a metal is used for the light-absorbing layer, it is necessary to insert an insulative film of less than 0.1 μm thickness beneath the light-absorbing layer to prevent leakage of the current. As the insulative film, it is possible to use a dielectric film or a film of any other material having the insulating effect.

In FIG. 2, each light-absorbing layer 112 is shown to extend to a corresponding side end of mesa 116. However, it may be terminated at a position between ridge stripe 111 and the side end of mesa 116.

In the GaN-based laser device 100 configured as described above, the light field in the lateral direction is confined in the waveguide portion corresponding to ridge stripe 111, due to the effective refractive index difference between the waveguide portion and the portions on the both sides thereof, and accordingly, thereby realizing the so-called effective refractive index wave-guiding. Further, since light-absorbing layers 112 are formed on the opposite sides of ridge stripe portion 111, stable lasing of the lateral transverse mode at a wavelength of 405 nm is obtained with a low threshold current, and then the kink level can be increased by more than 10 mW compared to the conventional case.

In the case that the light-absorbing layers are unprovided at the opposite sides of the waveguide in the direction parallel to the semiconductor junction surface, it is probable that the mode peak position is shifted or modes having a plurality of peaks are caused when the optical output of the laser is increased. However, with provision of the light-absorbing layers of the present embodiment, the light is absorbed at the sides of the waveguide, and thus, only a fundamental mode having a single peak can be made effective at the center of the waveguide. In the entire waveguide also, therefore, such a fundamental mode tends to become effective stably.

As a result, the yield of the laser devices suffering no kinks up to the output of 40 mW can be increased to 80%.

Further, although in the case of the GaN-based laser device having an active layer including added As or P, the concentration of As or P is liable to fluctuate and then the transverse mode is liable to become unstable, even in such a case, the kink level can be increased by provision of light-absorbing film 112.

Second Embodiment

Figure 5:
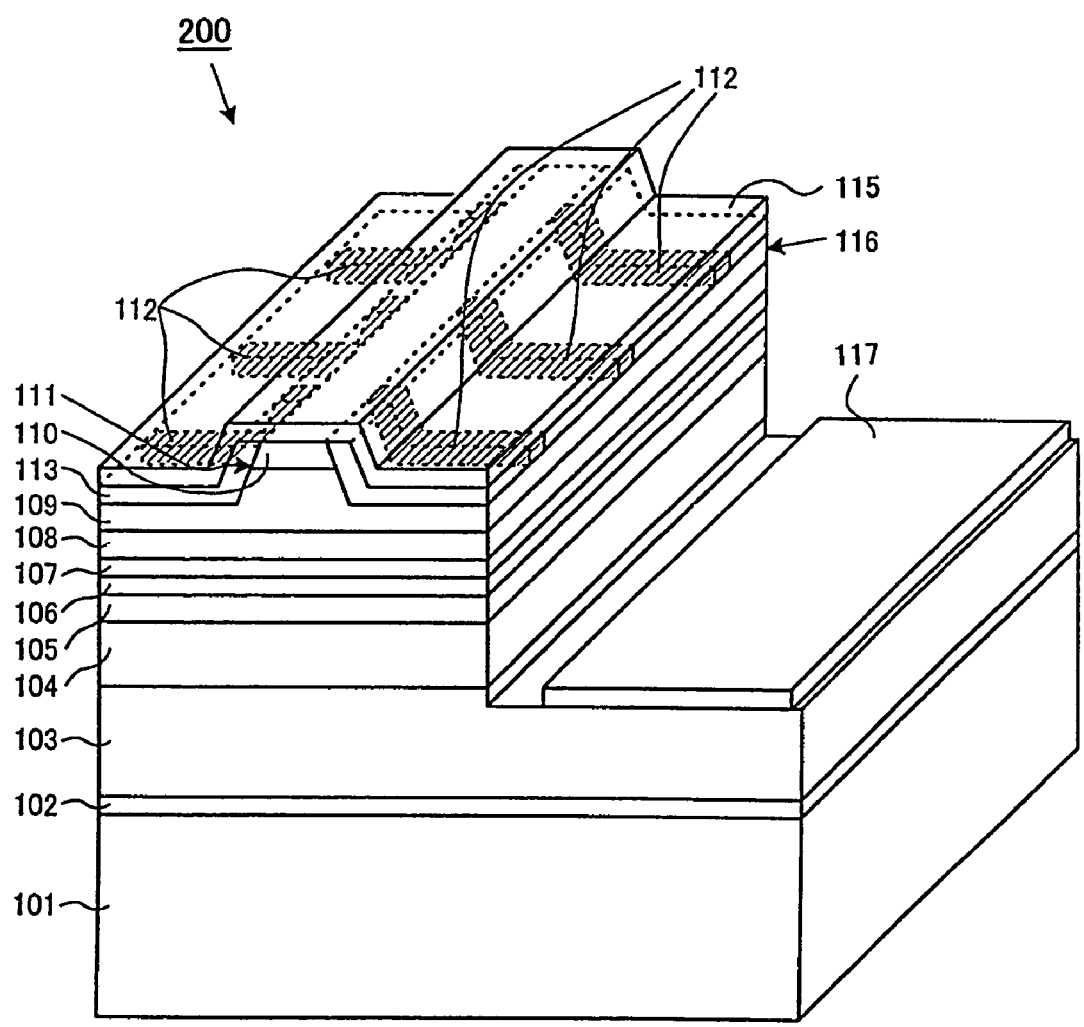
FIG. 5 is a schematic perspective view of a GaN-based semiconductor laser device according to a second embodiment of the present invention.
Figure 6:
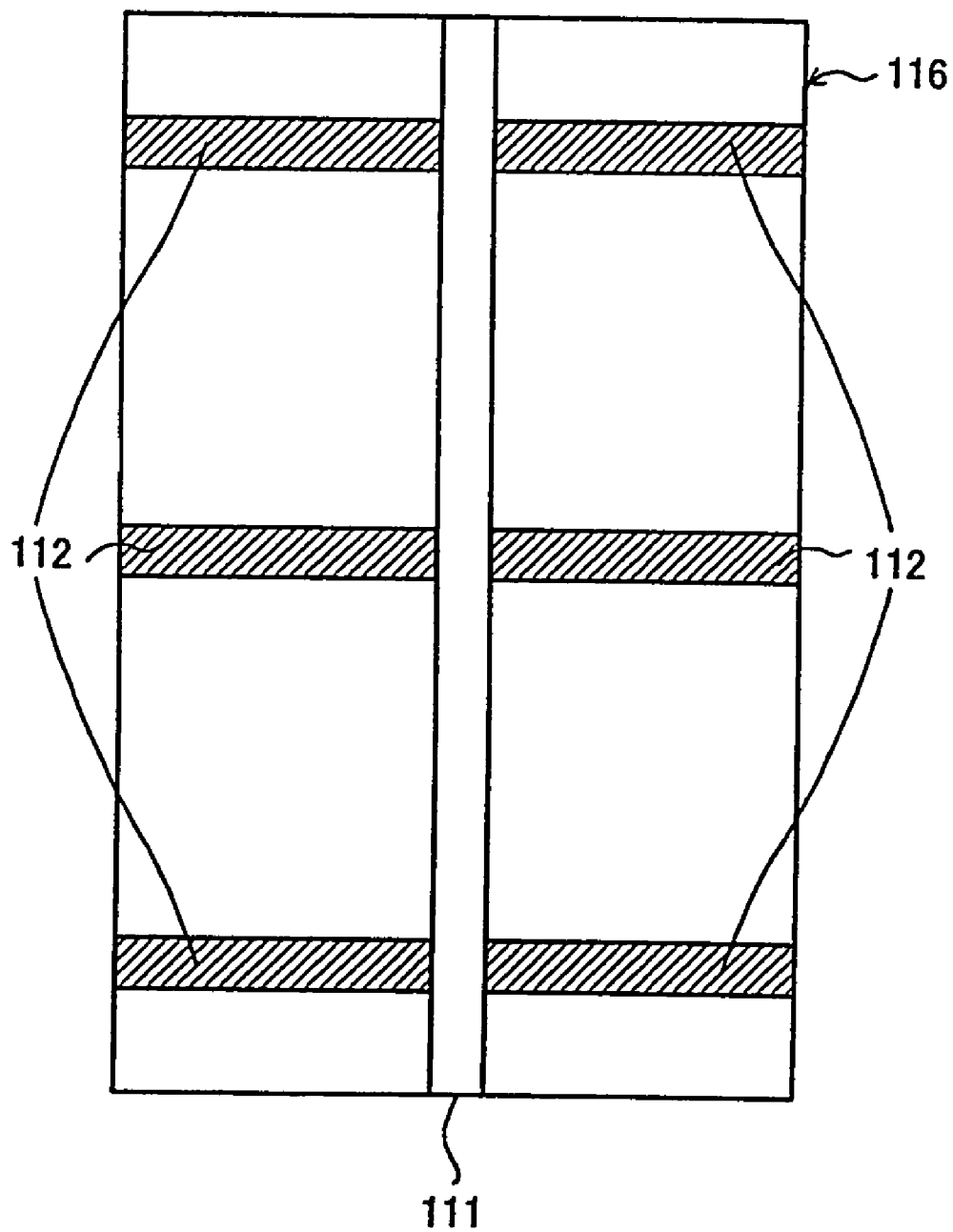
FIG. 6 is a schematic plan view corresponding to the GaN-based semiconductor laser device of FIG. 5.

FIGS. 5 and 6 similar to FIGS. 1 and 2 respectively, schematically illustrate a GaN-based laser device 200 according to the second embodiment.

A first point of difference of the second embodiment from the first embodiment is that the width of ridge stripe portion 111 provided at the upper portion of GaN-based laser device 200 is set to 1.5 μm, and each of three pairs of light-absorbing layers 112 each having a width of 5 μm is formed on the opposite sides of ridge stripe portion 111.

A second point of difference of the second embodiment from the first embodiment is that the cavity length of GaN-based laser device 200 is set to 650 μm.

At this time, the total width of light-absorbing layers 112 is set to satisfy the conditions of the width described in the first embodiment. Although light-absorbing layers 112 in all their pairs have the same width in the second embodiment, they may have different widths for the respective pairs. Further, the number of the pairs of light-absorbing layers 112 are not restricted to the three, and the light-absorbing layers may be arranged periodically.

The GaN-based laser of the second embodiment can also achieve stable lasing of the lateral transverse mode with a low threshold current. Formation of the plurality of pairs of light-absorbing layers 112 on the opposite sides of ridge stripe portion 111 results in an increased total width ratio of the light-absorbing layers with respect to the cavity length, so that the transverse mode is further stabilized and then the kink level can further be increased by more than 20 mW. As a result, the yield of the laser devices suffering no kinks up to the output of 40 mW can be increased to 90%.

Third Embodiment

Figure 7:
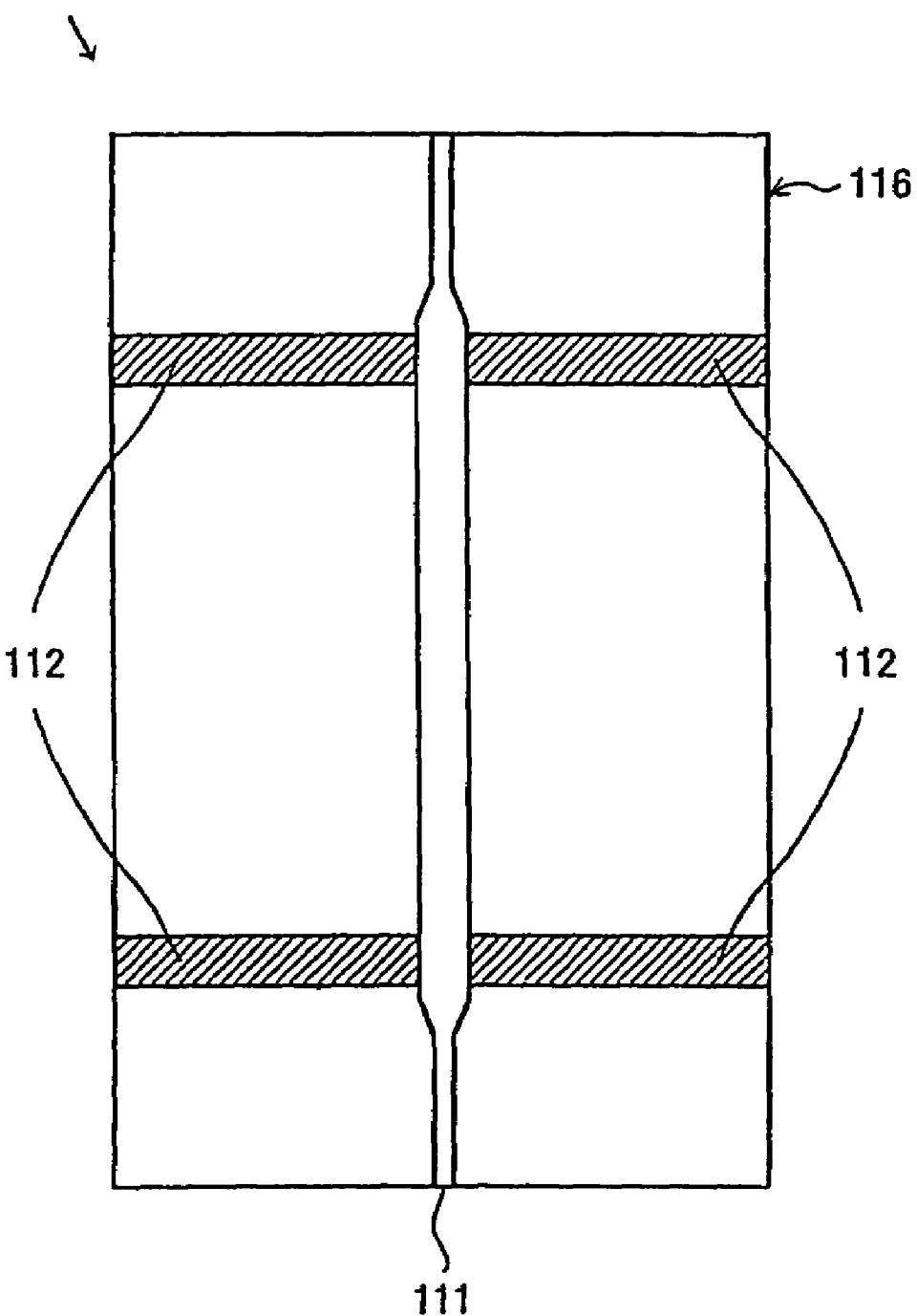
FIG. 7 is a schematic plan view of a GaN-based semiconductor laser device according to a third embodiment of the present invention.

FIG. 7 similar to FIGS. 2 and 6, schematically illustrates a GaN-based laser device 300 according to the third embodiment.

The third embodiment differs from the first and second embodiments in that ridge stripe portion 111 formed at the upper portion of GaN-based laser device 300 has a width of 1.0 μm in the vicinity of the mirror facets and a width of 2.5 μm at the center portion of the cavity. Two pairs of light-absorbing layers 112 each having a width of 2.5 μm are formed on the opposite sides of ridge stripe portion 111. This laser device has the cross section similar to those shown in FIGS. 3 and 4.

The cavity length of GaN-based laser device 300 of the third embodiment is similar to that of the first embodiment. The total width of light-absorbing layers 112 of the third embodiment is also set to satisfy the conditions similar to those of the second embodiment.

Since GaN-based laser 300 has ridge stripe 111 with the narrowed end portions, beam divergence in the lateral direction of the far field pattern (FFP) can be widened, so that the laser can suitably be incorporated into an optical device. This is because the asymmetry of FFP due to the fact that the end surface of the active region in the laser light emitting surface is much wider in the direction parallel to the semiconductor junction surface than in the vertical (up and down) direction can be improved by narrowing the end portions of ridge stripe 111 in the direction parallel to the junction surface. Further, since light-absorbing layers 112 are provided on the both sides of ridge stripe portion 111, GaN-based laser 300 also achieves stable lasing of the lateral transverse mode with a low threshold current. The kink level and the yield can also be improved similarly as in the case of the first embodiment.

Fourth Embodiment

Figure 8:
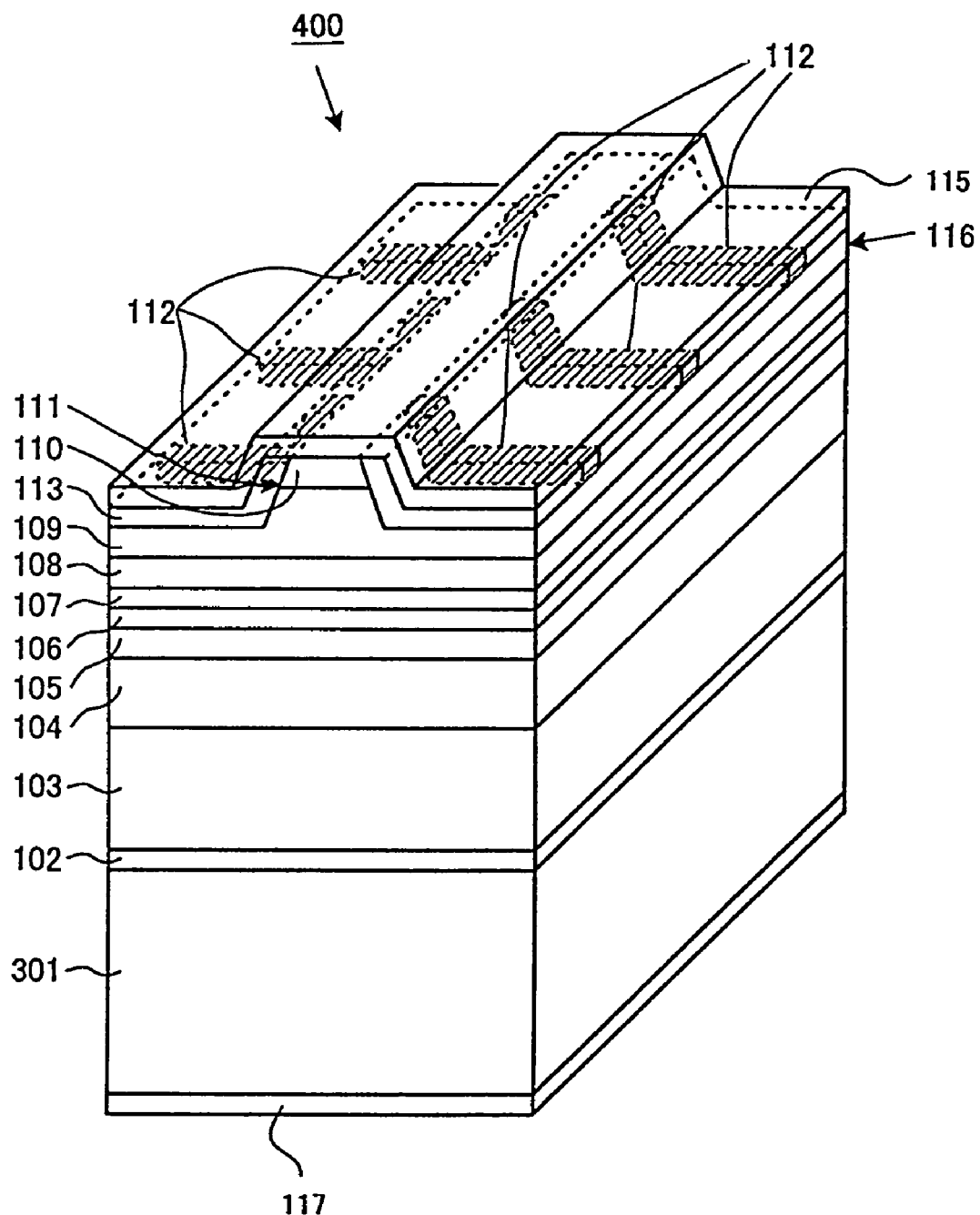
FIG. 8 is a schematic perspective view of a GaN-based semiconductor laser device according to a fourth embodiment of the present invention.
Figure 9:
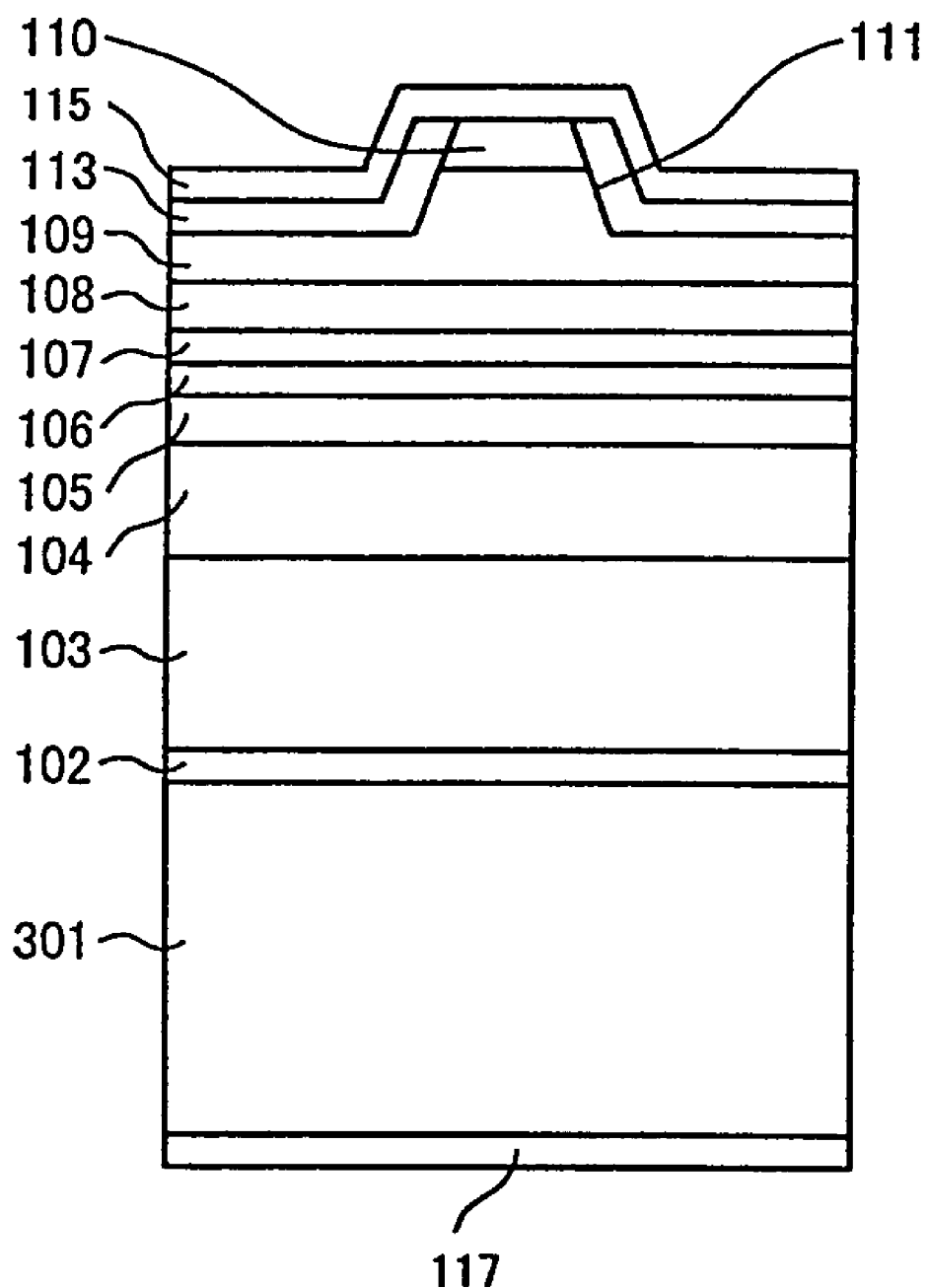
FIG. 9 is a schematic cross sectional view of the GaN-based semiconductor laser device of FIG. 8, taken at a region not including a light-absorbing film.
Figure 10:
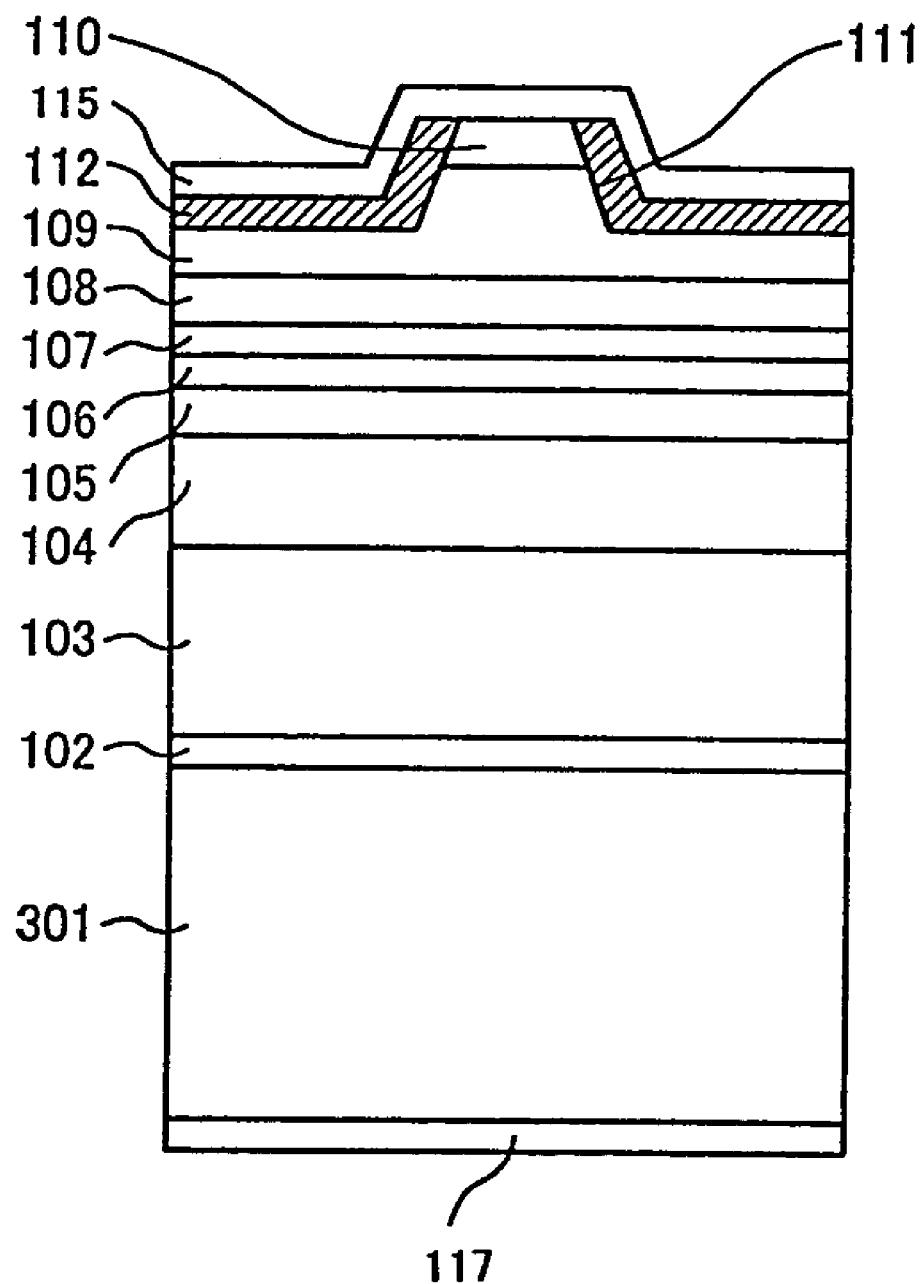
FIG. 10 is a schematic cross sectional view of the GaN-based semiconductor laser device of FIG. 8, taken at a region including the light-absorbing films.

FIGS. 8, 9 and 10 similar to FIGS. 1, 3 and 4 respectively, schematically illustrate a GaN-based laser device 400 according to the fourth embodiment.

A first point of difference of the fourth embodiment from the first through third embodiments is that an n-type GaN substrate 301 of a 450 μm thickness is used and it has a (0001) plane as its main surface for crystal growth. At this time, buffer layer 102 is provided for alleviating the surface strain and improving (flattening) the surface morphology and unevenness of the GaN substrate. The buffer layer may be omitted if the GaN substrate is good in crystallinity.

A second point of difference of the fourth embodiment from the first through third embodiments is that ridge stripe portion 111 formed at the upper portion of GaN-based laser device 400 has a width of 2.5 μm.

A third point of difference of the fourth embodiment from the first through third embodiments is that ridge stripe portion 111 is formed exactly in the <1–100> direction of n-type GaN substrate 301, for the purpose of forming the mirror facets by cleavage. The configurations (width and number) of light-absorbing films 112 of the fourth embodiment are similar to those of the second embodiment.

A fourth point of difference of the fourth embodiment from the first through third embodiments is that n-side electrode 117 is formed on the back surface side of the laser device, i.e., on the n-type GaN substrate side. Thus, as seen from FIG. 8, the current required for the lasing operation is introduced between the top surface side and the bottom surface side of the device.

The mirror facets are formed by cleaving the wafer together with n-type GaN substrate 301. At this time, the cavity length is set to 500 m.

The laser device formed as described above is shown in FIG. 8 in schematic perspective view. For the laser device 400 of FIG. 8, FIG. 9 shows the schematic cross section not including light-absorbing film 112, and FIG. 10 shows the schematic cross section including light-absorbing films 112. FIG. 6 may be referred to as a plan view of laser device 400 of FIG. 8.

The total width of light-absorbing layers 112 in the fourth embodiment is again set to satisfy the conditions similar to those of the second embodiment. GaN-based laser device 400 can also achieve the effects similar to those of the second embodiment.

Fifth Embodiment

Figure 11:
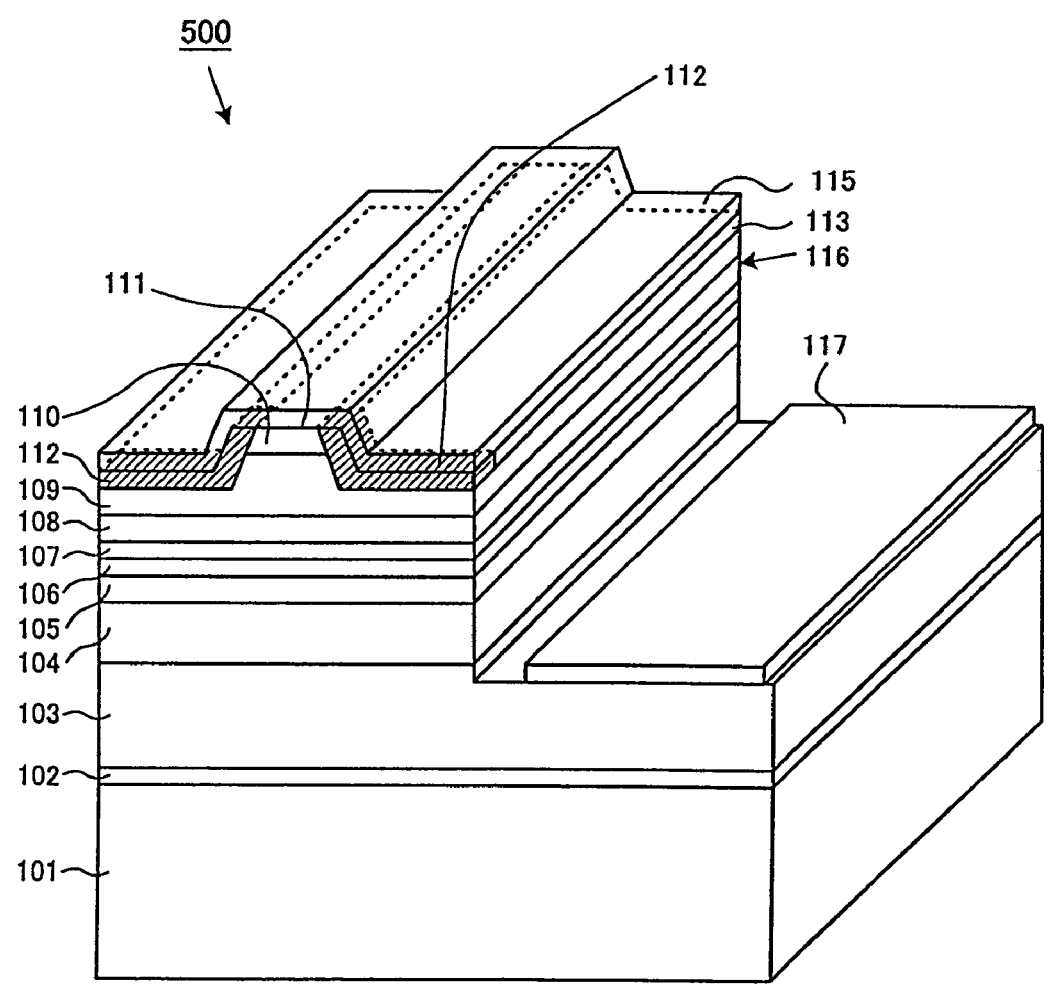
FIG. 11 is a schematic perspective view of a GaN-based semiconductor laser device according to a fifth embodiment of the present invention.
Figure 12:
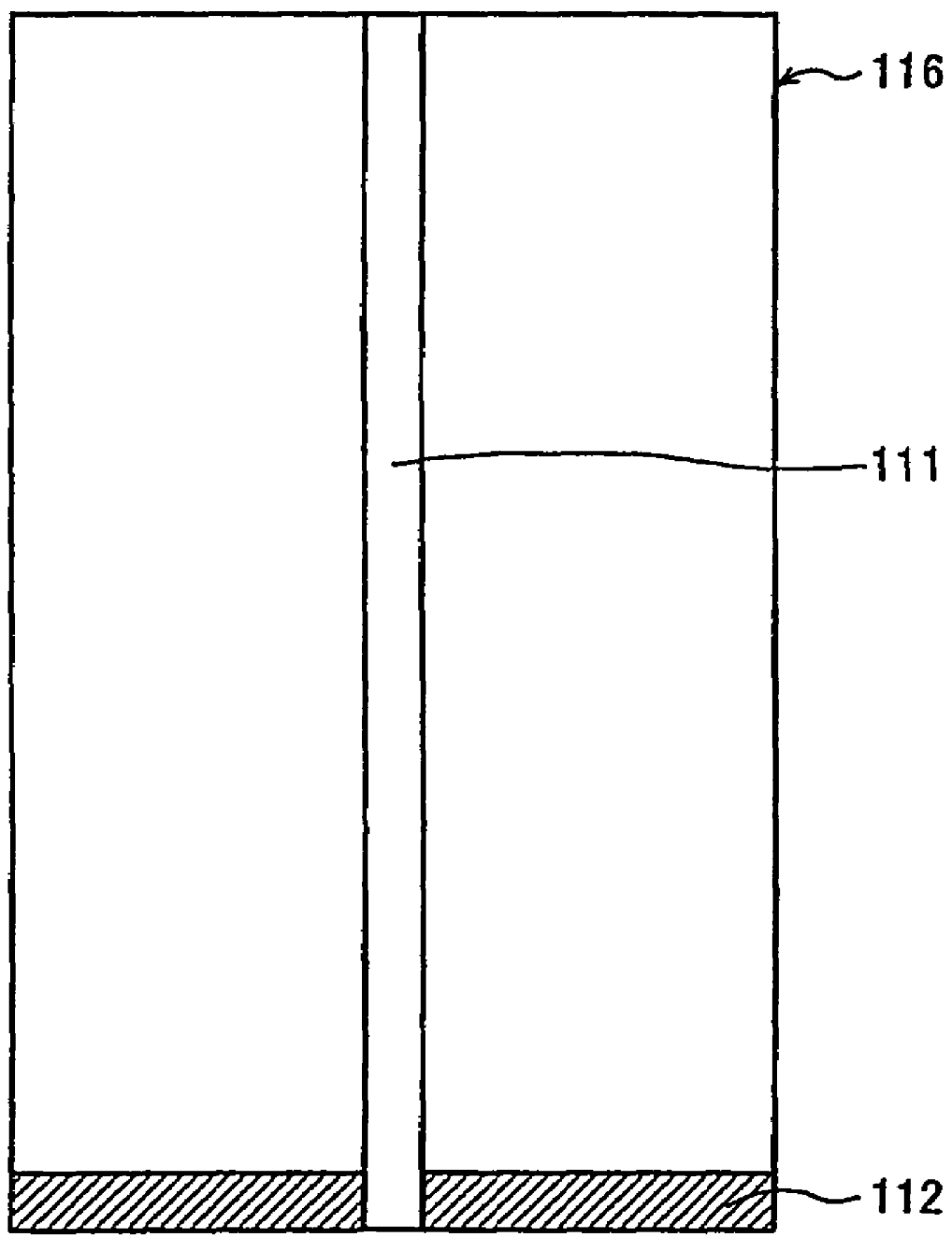
FIG. 12 is a schematic plan view corresponding to the GaN-based semiconductor laser device of FIG. 11.

FIGS. 11 and 12 similar to FIGS. 1 and 2 respectively, schematically illustrate a GaN-based laser device 500 according to the fifth embodiment.

The fifth embodiment differs from the first through third embodiments in that ridge stripe portion 111 at the upper portion of GaN-based laser device 500 is formed with a width of 1.5 μm, and that a pair of light-absorbing layers 112 each having a width of 4 μm are formed on opposite sides of ridge stripe 111 on the light-emitting facet side of the cavity. Although light-absorbing layers 112 are provided only on the light-emitting side of the cavity in the fifth embodiment, additional light-absorbing layers may be provided on the light-reflecting side, or a greater number of light-absorbing layers may be provided additionally. In the fifth embodiment, again, the total width of light-absorbing layers 112 is set to satisfy the conditions similar to those described in the second embodiment.

With this GaN-based laser 500, the kink level can be increased by more than 10 mW and then the effect similar to that of the first embodiment can be obtained regarding the yield. Further, in the fifth embodiment, provision of light-absorbing layers 112 on the light-emitting side of the laser device make it possible to obtain the effect of improving the FFP similarly as in the third embodiment.

Sixth Embodiment

Figure 13:
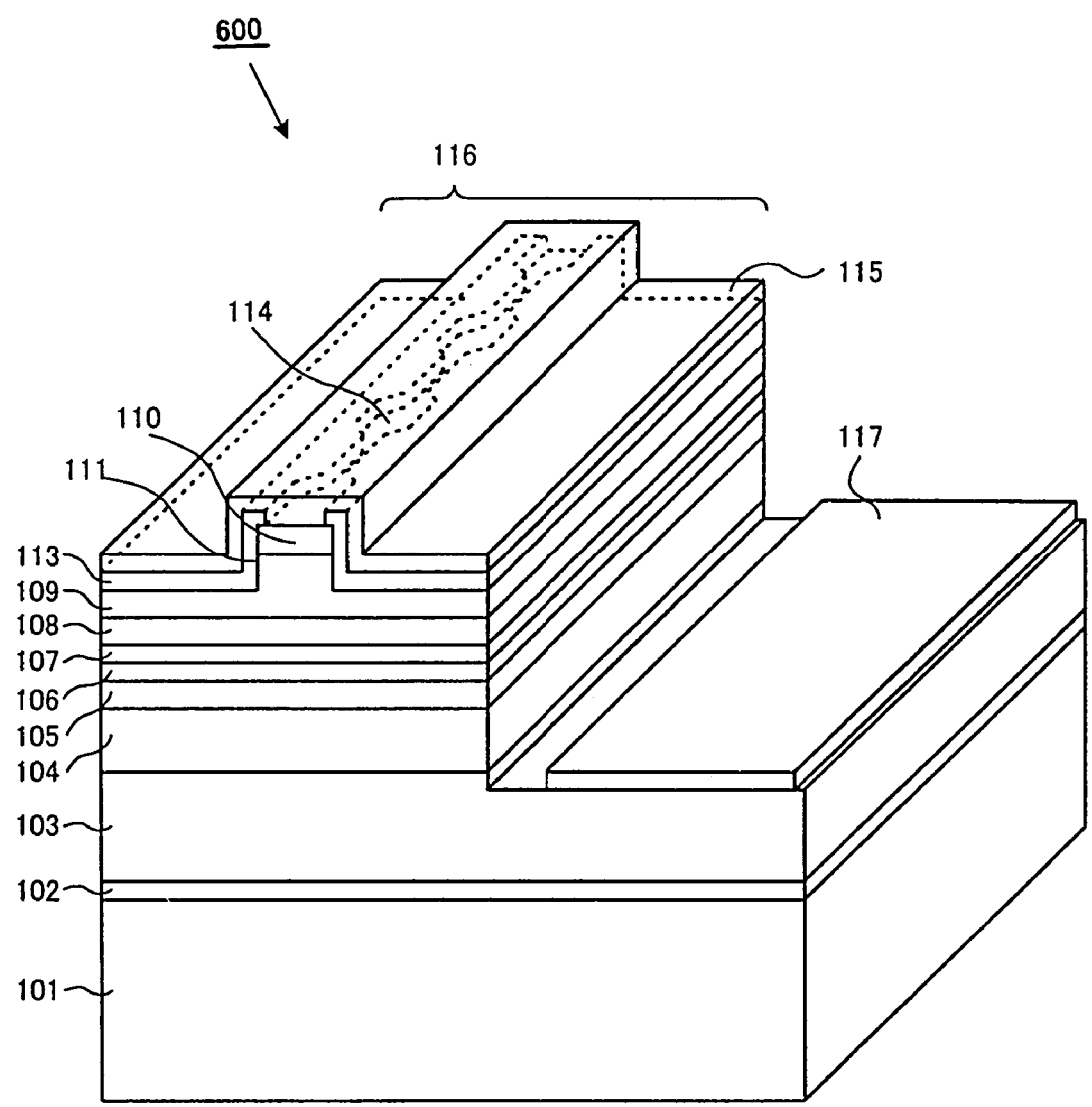
FIG. 13 is a schematic perspective view of a GaN-based semiconductor laser device according to a sixth embodiment of the present invention.
Figure 14:
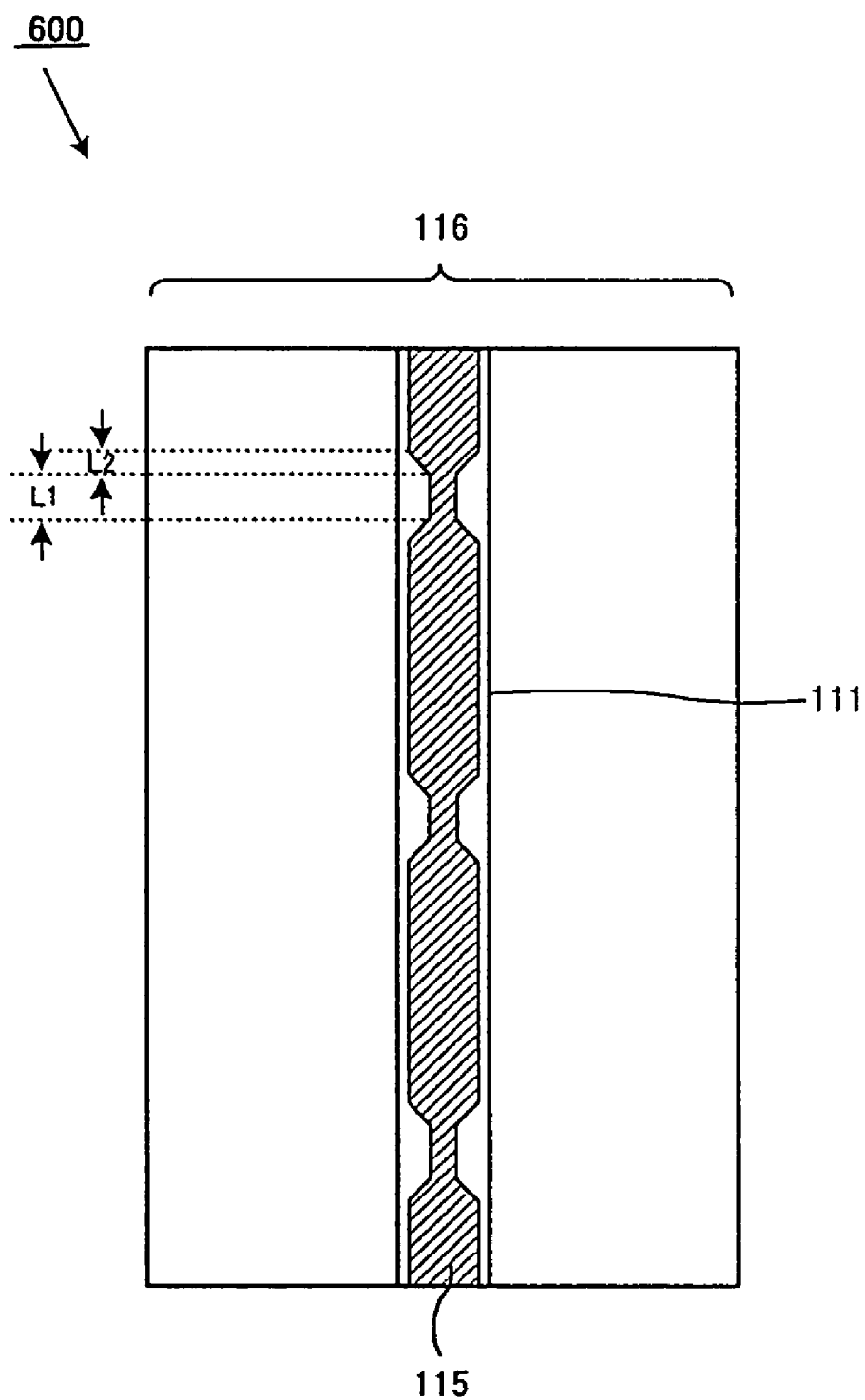
FIG. 14 is a schematic plan view corresponding to the GaN-based semiconductor laser device of FIG. 13.
Figure 15:
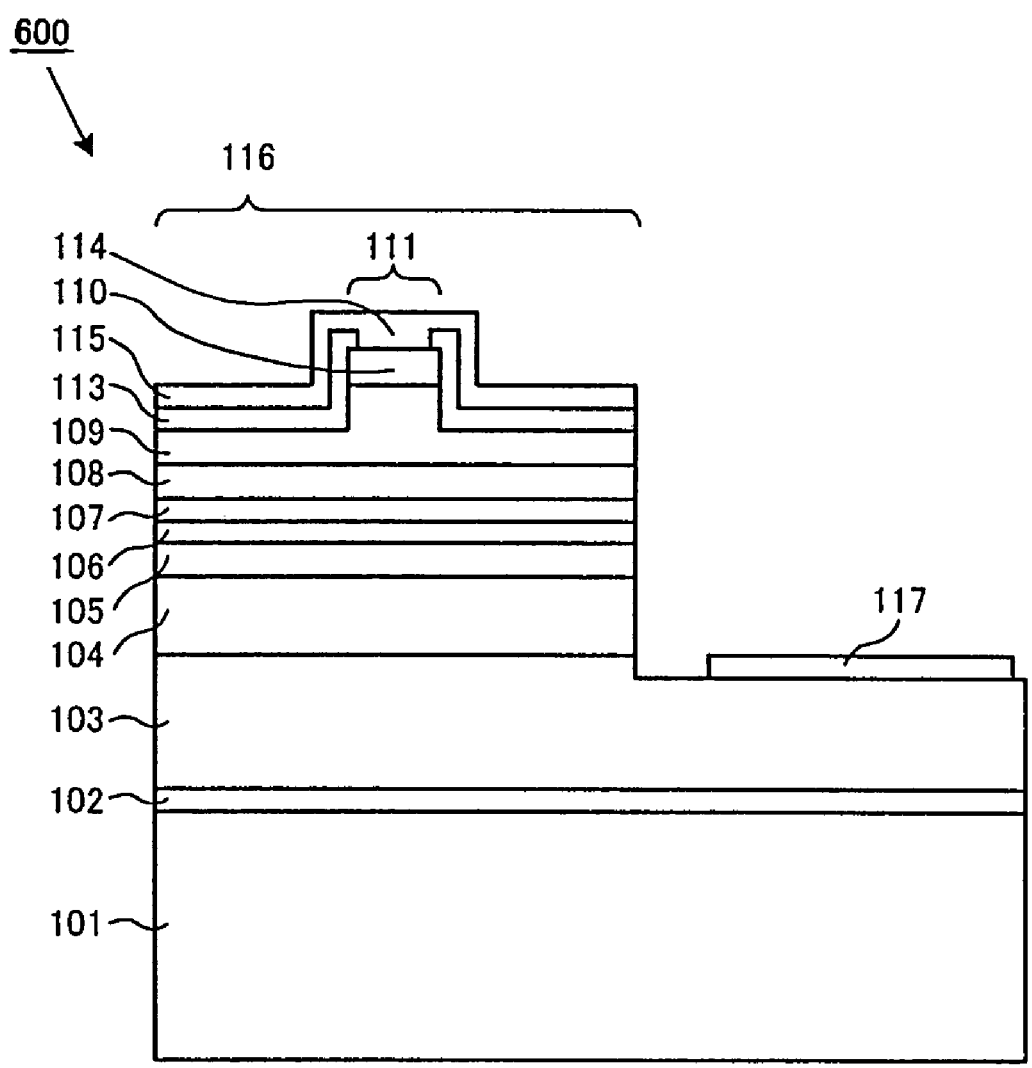
FIG. 15 is a schematic cross sectional view corresponding to the GaN-based semiconductor laser device of FIG. 13.

A GaN-based semiconductor laser device 600 according to the sixth embodiment is shown in perspective view of FIG. 13, in plan view of FIG. 14, and in cross sectional view of FIG. 15. The dotted lines in FIG. 13 represent dielectric film 113 hidden beneath p-side electrode 115. In FIG. 14, only a portion corresponding to mesa portion 116 is shown with the adjacent regions not shown. In FIG. 14, only a portion of p-side electrode 115 in contact with p-type GaN contact layer 110 is illustrated for better understanding of the features of the sixth embodiment.

In forming the laser device of the sixth embodiment, firstly, a GaN substrate 101 of a thickness of 100–500 μm (e.g., 400 μm) having a (0001) main surface for crystal growth is rinsed, which is followed by high-temperature cleaning at about 1100° C. in a hydrogen ($H_2$) atmosphere within a MOCVD apparatus. After the substrate temperature is lowered to about 600° C., $H_2$ of a carrier gas, silane ($SiH_4$), ammonia ($NH_3$), and trimethyl gallium (TMG) are introduced into the reactive chamber to grow an n-type GaN buffer layer 102 of a thickness of 10 nm to 10 μm (e.g., 100 nm). Incidentally, since buffer layer 102 is provided for alleviating the surface strain and improving (flattening) the surface morphology and unevenness of GaN substrate 101, it can be omitted if GaN substrate 101 is good in crystallinity.

Next, while $N_2$ and $NH_3$ are introduced, the substrate temperature is raised to about 1050° C. Thereafter, the carrier gas is changed from $N_2$ to $H_2$, and TMG and $SiH_4$ are introduced to grow an n-type GaN contact layer 103 to a thickness of 0.1–10 μm (e.g., 4 μm).

Thereafter, TMG and trimethyl aluminum (TMA) are introduced at a prescribed ratio to deposit an n-type $Al_{0.1}Ga_{0.9}N$ layer of a thickness of 0.5–1.0 μm (e.g., 0.9 μm), to thereby form an n-type AlGaN clad layer 104. With the supply of TMA stopped, TMG is introduced to grow an n-type GaN guide layer 105 to a thickness of 50–200 nm (e.g., 100 nm).

Next, the supply of TMG is stopped, the carrier gas is changed from $H_2$ back to $N_2$, and the substrate temperature is lowered to 700° C. Trimethyl indium (TMI) and TMG are introduced to grow a barrier layer (not shown) of $In_vGa_{1-v}N$ (0<v<1). Subsequently, the supply amount of TMI is increased to a prescribed level to grow a quantum well layer (not shown) of $In_wGa_{1-w}N$ (0≦w≦1). These steps are repeated to form an InGaN multiple quantum well active layer 106 having an alternately stacked-layered structure of InGaN barrier layers and InGaN well layers (barrier layer/ well layer/ . . . well layer/barrier layer). The composition ratios and thicknesses of the InGaN films constituting the barrier and well layers are designed to obtain the emission wavelength in a range of 370–430 nm, and two to six well layers (most preferably three well layers) are provided.

After formation of InGaN multiple quantum well active layer 106, the supply of TMI and TMG is stopped, and the substrate temperature is raised again to 1050° C. The carrier gas is again changed from $N_2$ to $H_2$. TMG, TMA, and bis-cyclopentadienyl magnesium ($Cp_2Mg$) of a p-type dopant are introduced to deposit p-type $Al_{0.2}Ga_{0.8}N$ to a thickness of 0–20 nm (e.g., 10 nm), to form a p-type AlGaN evaporation preventing layer 107. This evaporation preventing layer can be omitted in some cases. Next, with the supply of TMA stopped, the supply amount of TMG is adjusted to grow a p-type GaN light guide layer 108 to a thickness of 50–200 nm (e.g., 100 nm). Subsequently, with TMA introduced at a prescribed ratio, the flow rate of TMG is controlled to deposit a p-type $Al_{0.1}Ga_{0.9}N$ layer of a thickness of 0.5–1.0 μm (e.g., 0.5 μm) to thereby form a p-type AlGaN clad layer 109.

Thereafter, with the supply of TMA stopped, the supply amount of TMG is controlled to grow a p-type GaN contact layer 110 to a thickness of 0.01–10 μm (e.g., 0.1 μm). After the growth thereof, the supply of TMG and $Cp_2Mg$ is stopped, the substrate temperature is lowered to a room temperature, and the obtained wafer is taken out of the MOCVD apparatus.

The wafer thus obtained is then processed into laser devices. Firstly, in forming a p-side electrode portion, a stripe-shaped resist pattern of a width of 4 μm is formed on p-type contact layer 110 in the <1–100> direction of GaN substrate 101, and RIE is conducted to form a ridge stripe portion 111.

After the resist is removed, another resist pattern including a wide portion of a width W1=3 μm and a narrow portion of a width W2=1.9 μm for a current-introducing window portion 114 is formed on ridge stripe 111, and a $SiO_2$ film is deposited to form a dielectric film 113 for constricting the current. The resist is then removed, and the window portion 114 is provided in dielectric film 113 to partially expose p-type GaN contact layer 110. Pd, Mo and Au are deposited in this order by evaporation, to thereby form a p-side electrode 115. As the materials for the p-side electrode, Pd/Pt/Au, Pd/Au, or Ni/Au can be used alternatively. Next, following formation of a protective film of the resist, dry etching is conducted to form a mesa portion 116, exposing a portion of n-type GaN contact layer 103. On the exposed portion, Ti and Al are deposited in this order by evaporation, to form an n-side electrode 117. As the materials for the n-side electrode, Hf/Al, Ti/Mo, or Hf/Au can be used alternatively.

The wafer processed up to formation of the n-side electrode is cleaved to form mirror facets, and further divided parallel to a longitudinal direction of the cavity to obtain laser device chips. At this time, the cavity length is set to 650 μm for example.

In FIGS. 13 and 14 showing the sixth embodiment, width W0 of ridge stripe 111 is set to 4 μm, width W1 of the wide portion in current-introducing window portion 114 is set to 3 μm, and width W2 of the narrow portion is set to 1.9 μm, for example. Three such narrow portions are provided in current-introducing window portion 114. A length L1 of the narrow portion is set to 30 μm, and a length L2 of a transition portion from the wide portion to the narrow portion is set to 10 μm.

In the GaN-based laser device 600 as shown in FIG. 15, the light field in the lateral direction is confined in the portion corresponding to ridge stripe 111 because of the effective refractive index difference between the portion corresponding to ridge stripe 111 and the portions on both sides thereof, so that it is possible to realize the so-called effective refractive index waveguide. With this GaN-based laser, it is possible to cause lasing with the lateral transverse mode at the wavelength of 405 nm. Further, since current-introducing window portion 114 provided on ridge stripe 111 includes the narrow portions, the kink level can be increased by more than about 10 mW compared to the conventional case.

If current-introducing window portion 114 is unprovided with the narrow portions, the mode peak position will be shifted or modes including a plurality of mode peak positions will be caused when the optical output of the laser is increased. By provision of the narrow portion in current-introducing window portion 114, however, the light is absorbed and the gain is not obtained in the large gap between the window portion and the side of the waveguide. As such, only a fundamental mode having a single peak can be made effective at the center in the lateral direction of the waveguide. In the entire waveguide also, therefore, such a fundamental mode tends to become effective stably. Accordingly, the yield of the laser devices suffering no kinks up to 40 mW can be increased to about 80%.

Further, the threshold voltage of this GaN-based laser device can be lowered by about 10% compared to that of a GaN-based laser device having a window portion of a uniform width and a stripe-shaped waveguide narrowed so as to have the similar kink level.

To obtain a GaN-based laser device having such effects, the total length of the narrow portions in current-introducing window portion 114 is designed not to exceed ½ of the cavity length. The narrow portions longer than the above would adversely increase the operation voltage of the device. Although the narrow portions are set to have the same length of L1 in the sixth embodiment, it is possible to make the lengths of the narrow portions different from each other. The ratio of length L2 of the transition portion to length L1 of the narrow portion may also be changed, as long as the total length of the narrow portions is less than ½ of the cavity length. In an extreme case, L2 can be 0. Further, the transition portion from the wide portion to the narrow portion does not have to be linear, which may be curved instead.

The width W0 of ridge stripe 111 is designed to satisfy 1 μm≦W0≦4 μm. If W0 is less than 1 μm, the area available for the current-introducing portion is restricted to less than 1 μm, which may cause increase of the operation voltage. If W0 is more than 4 μm, the width of the ridge waveguide is widened, and modes including a plurality of peaks are liable to be caused.

The width W1 of the wide portion and the width W2 of the narrow portion in current-introducing window portion 114 are set to satisfy 1 μm≦W1≦4 μm, 0.3 μm≦W1−W2≦3.5 μm, and 0 μm<W2. To achieve the effect of preventing the kink, the value of W1−W2 needs to be at least about 0.3 μm, though the mode would not become effective if W2=0. The value of W1−W2 may be set small when the total length of the narrow portions is long, and vice versa, taking account of both increasing the light absorbing effect and preventing the increase of the operating voltage of the device. Although the number of the narrow portions may be increased to increase the total length of the narrow portions, the increase in number of the narrow portions causes a large change of the wave guide width per unit length of the ridge stripe. In such a case, the light of the mode propagating is dispersed, and the threshold voltage is increased. The number of the narrow portions may be set to less than about 10, since the increase of the threshold value occurs with about ten or more such narrow portions.

In FIGS. 13 and 14, there is shown a gap between the wide portion of current-introducing window portion 114 and the side surface of ridge stripe 111, though such a gap can be omitted if it is preferred to do so. In FIGS. 13 and 15, the side surface of ridge stripe 111 is perpendicular to the main surface of the GaN-based semiconductor layer, though the side surface may be tilted.

Incidentally, in the GaN-based laser device having the active layer including added As or P, local fluctuation of the composition ratio of As or P is liable to cause disturbance of the transverse mode. Even in such a case, provision of the narrow portions of current-introducing window portion 114 can increase the kink level.

Seventh Embodiment

Figure 16:
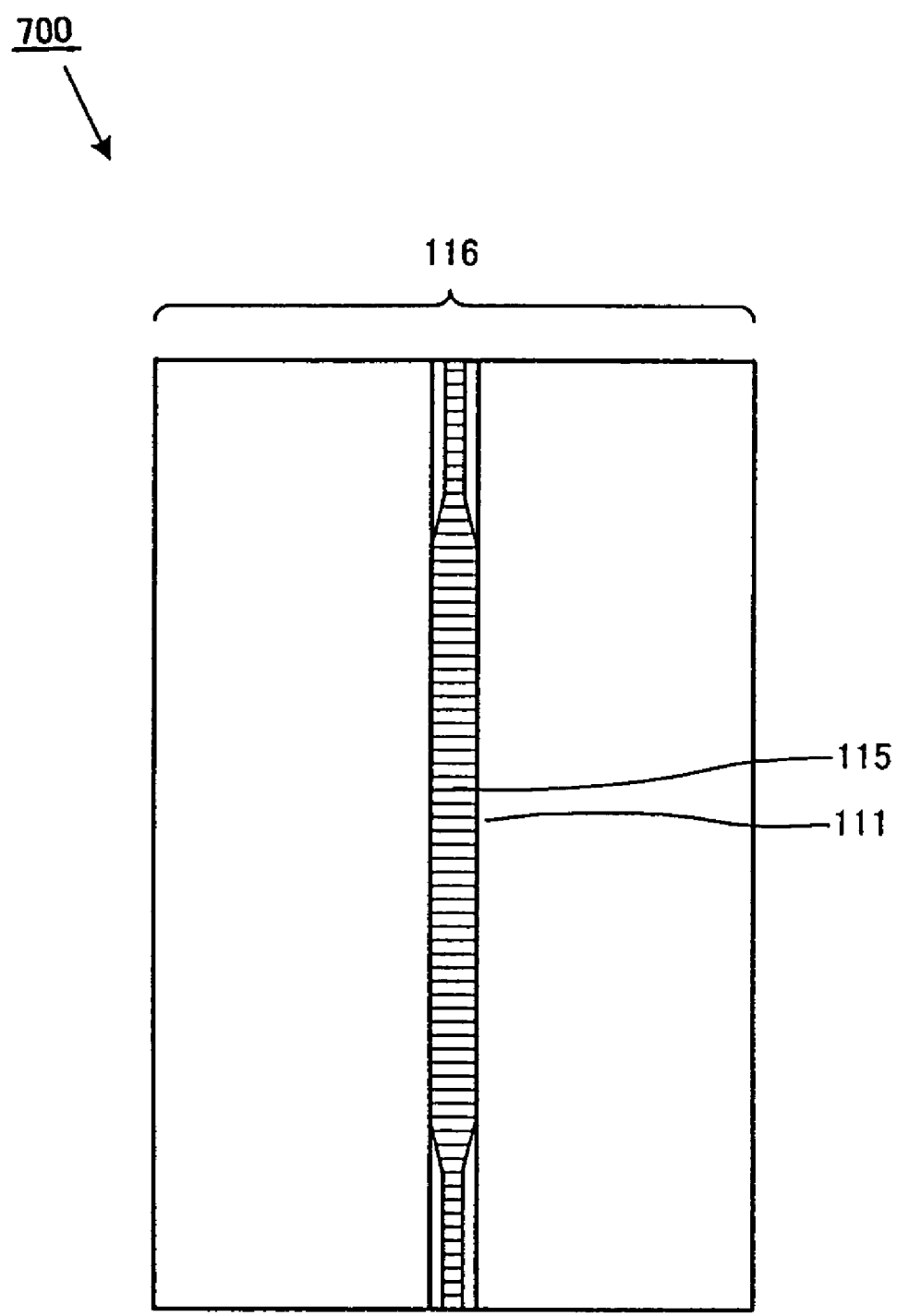
FIG. 16 is a schematic plan view of a GaN-based semiconductor laser device according to a seventh embodiment of the present invention.

FIG. 16 similar to FIG. 14, schematically illustrates a GaN-based semiconductor laser device 700 according to the seventh embodiment. FIG. 15 may be referred to as a cross section of GaN-based semiconductor laser device 700.

A first point of difference of the seventh embodiment from the sixth embodiment is that the ridge stripe width is set to 2.5 μm. Since the ridge stripe width in this case is narrower than in the sixth embodiment, the kink level can further be improved.

A second point of difference of the seventh embodiment from the sixth embodiment is that current-introducing window portion 114 is formed to have a wide portion of a width W1=2.5 μm and a narrow portion of a width W2=1.2 μm. In the seventh embodiment, as shown in FIG. 16, p-side electrode 115 is provided with effective narrow portions on the laser light emitting surface side and on the reflecting surface side. The length L1 of each narrow portion is set to 50 μm, and the length L2 of each transition portion from the wide portion to the narrow portion is set to 20 μm.

A third point of difference of the seventh embodiment from the sixth embodiment is that the mirror facets of the laser are formed by dry etching.

A fourth point of difference of the seventh embodiment from the sixth embodiment is that the cavity length of the laser is set to 450 μm.

GaN-based laser device 700 configured as described above has a kink level similar to that of the sixth embodiment. The yield of the devices suffering no kinks up to 40 mW is more than about 80%, similarly as in the case of the first embodiment. The device of the seventh embodiment has the threshold voltage again similar to that of the sixth embodiment. Further, in the device of the seventh embodiment, current-introducing window portion 114 has the narrow portion on the light emitting facet side, so that the far field pattern (FFP) is widened in the lateral direction of the emitted laser light. Such a laser device can suitably be used for an optical recording/reproducing apparatus.

It is generally known that the FFP becomes an ellipse elongated in a vertical direction due to the fact that, in the laser light emitting facet, the end surface of the active region is much wider in the direction parallel to the semiconductor junction surface than in the vertical direction. However, since the portion for introducing the current is narrowed in the vicinity of the mirror facet, the region where the gain is obtained by introduction of the current is also narrowed, so that the substantial width of the active layer can be narrowed in the direction parallel to the junction surface. As a result, the elliptical FFP pattern is widened in the lateral direction to approach a circle.

In the seventh embodiment, current-introducing window portion 114 has two narrow portions provided on the laser light emitting side and the reflecting side, respectively. However, additional narrow portions may be provided in places, or only one narrow portion may be provided on the light emitting surface side.

Eighth Embodiment

Figure 17:
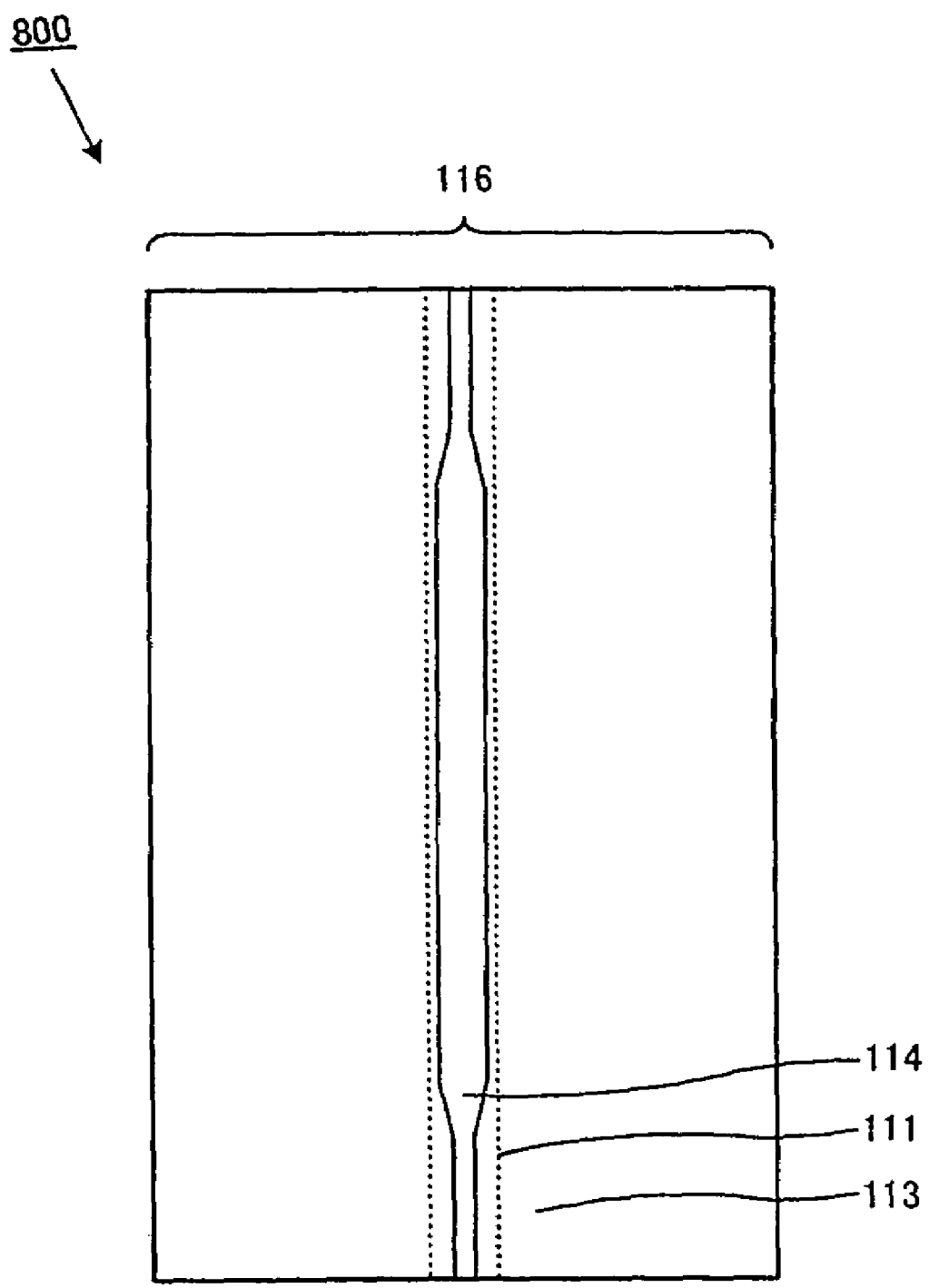
FIG. 17 is a schematic plan view of a GaN-based semiconductor laser device according to an eighth embodiment of the present invention.
Figure 18:
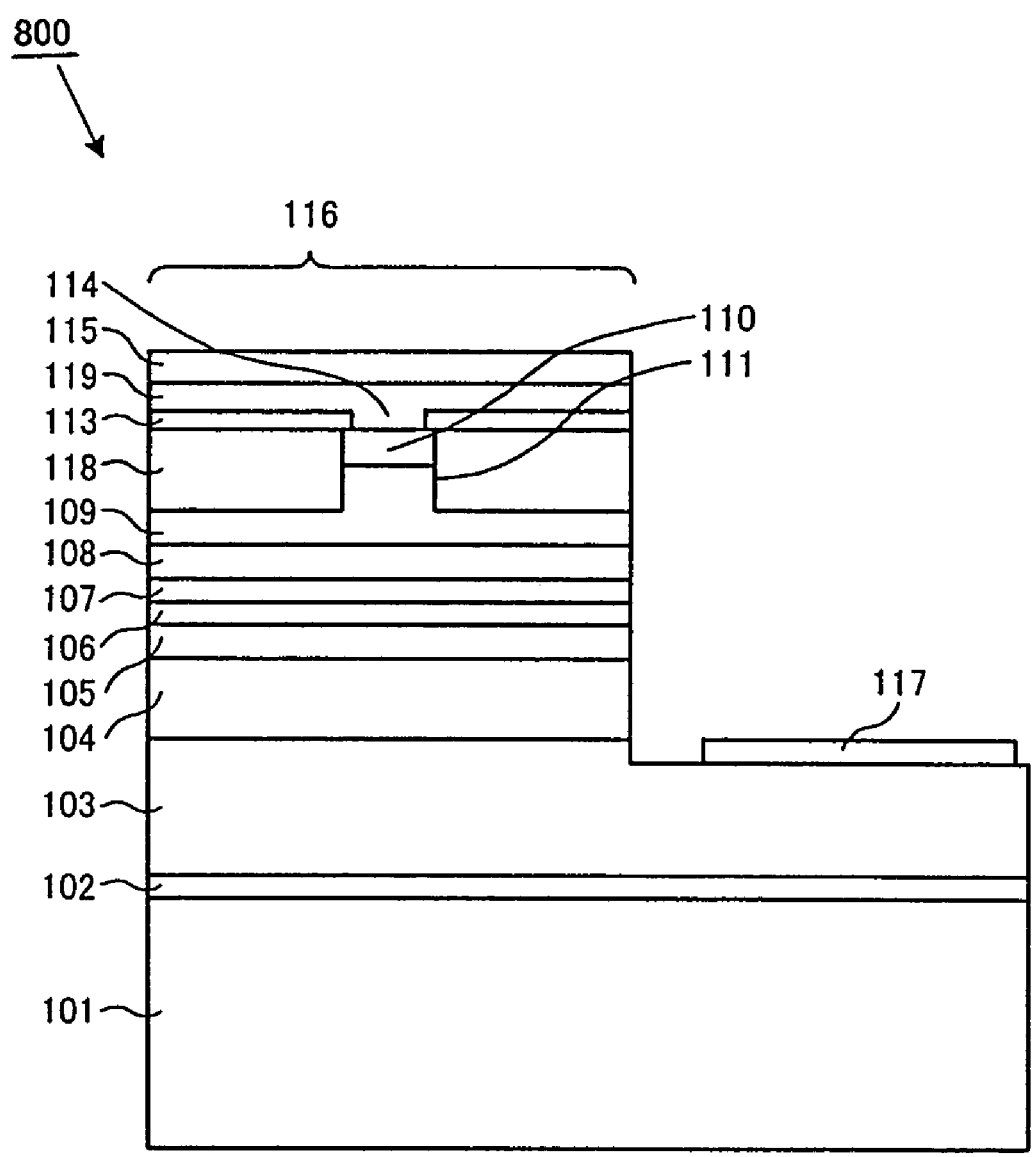
FIG. 18 is a schematic cross sectional view corresponding to the GaN-based semiconductor laser device of FIG. 17.

FIGS. 17 and 18 similar to FIGS. 14 and 15 respectively, schematically illustrate a GaN-based semiconductor laser device 800 according to the eighth embodiment.

A first point of difference of the eighth embodiment from the sixth and seventh embodiments is that ridge stripe 111 of a width W0=3 μm is embedded in embedding layers 118. Current-introducing window portion 114 provided in dielectric film 113 on the ridge stripe serves to constrict the current. A second p-type GaN contact layer 119 and p-side electrode 115 are formed further over dielectric film 113.

A second point of difference of the eighth embodiment from the sixth and seventh embodiments is that current-introducing window portion 114 has a wide portion of a width W1=2.2 μm and a narrow portion of a width W2=1.3 μm. Further, in the eighth embodiment, current-introducing window portion 114 is provided with narrow portions on the laser light emitting facet side and on the reflecting facet side, as shown in FIG. 17. The length L1 of each narrow portion is set to 60 μm, and the length L2 of each transition portion from the wide portion to the narrow portion is set to 30 μm.

In forming the laser device of the eighth embodiment, the process similar to that of the sixth embodiment is employed up to formation of ridge stripe 111. Thereafter, with the $SiO_2$ mask (not shown) covering ridge stripe 111 unremoved, n-type $Al_{0.1}Ga_{0.9}N$ embedding layers 118 are deposited, again by MOCVD, to the extent that their upper surfaces are flush with the top surface of ridge stripe 111. At this time, the upper surface of each embedding layer 118 is adjusted to a position within ±0.1 μm from the top surface of ridge stripe 111, which facilitates subsequent formation of the window portion 114.

Next, the $SiO_2$ mask covering ridge stripe 111 is removed, and a resist pattern having a wide portion of a width W1=2.2 μm and a narrow portion of a width W2=1.3 μm is formed on the top surface of ridge stripe 111, and $SiO_2$ is deposited to form dielectric film 113 for constricting the current. Further, second p-type GaN contact layer 119 is grown by MOCVD to a thickness of 0.2 μg/m, and p-side electrode 115 is formed thereon. Thereafter, the obtained wafer is subjected to pseudo cleavage to form mirror facets, and further divided by dicing into device chips.

A third point of difference of the eighth embodiment from the sixth and seventh embodiments is that the cavity length of the laser is set to 550 μm.

GaN-based laser device 300 configured as described above has the kink level similar to that of the sixth embodiment. The yield of the devices suffering no kinks up to 40 mW is more than about 80%, similarly as in the case of the sixth embodiment. Further, in the eighth embodiment, the current-introducing window portion has the narrow portion on the light emitting facet side, so that the effect similar to that in the seventh embodiment can be obtained. Incidentally, in the eighth embodiment, the narrow portions of the current-introducing window portion are provided at two positions on the laser light emitting side and on the reflecting side, though additional narrow portions may be provided in places, or only one narrow portion may be provided on the light emitting facet side, similarly as in the case of the seventh embodiment.

Ninth Embodiment

Figure 19:
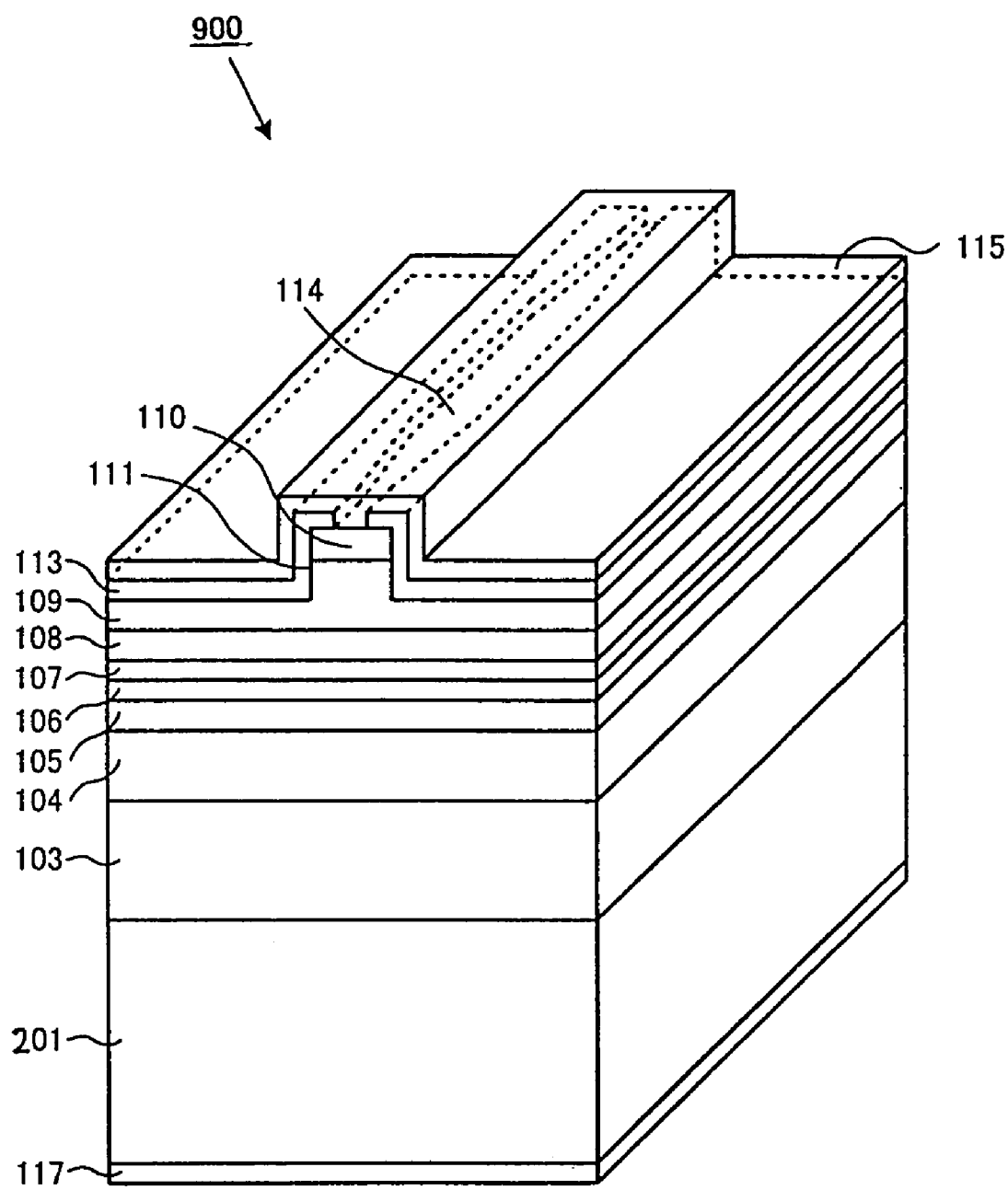
FIG. 19 is a schematic perspective view of a GaN-based semiconductor laser device according to a ninth embodiment of the present invention.
Figure 20:
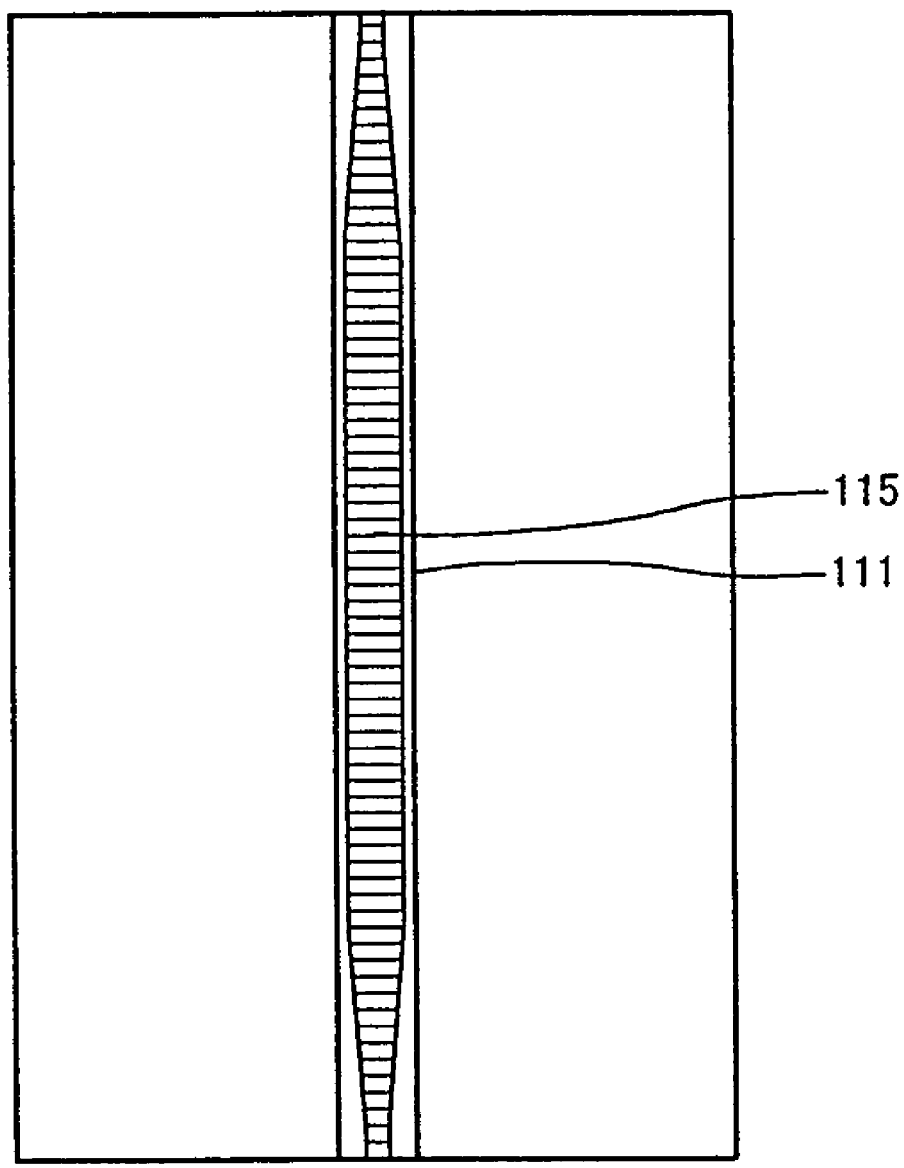
FIG. 20 is a schematic plan view corresponding to the GaN-based semiconductor laser device of FIG. 19.
Figure 21:
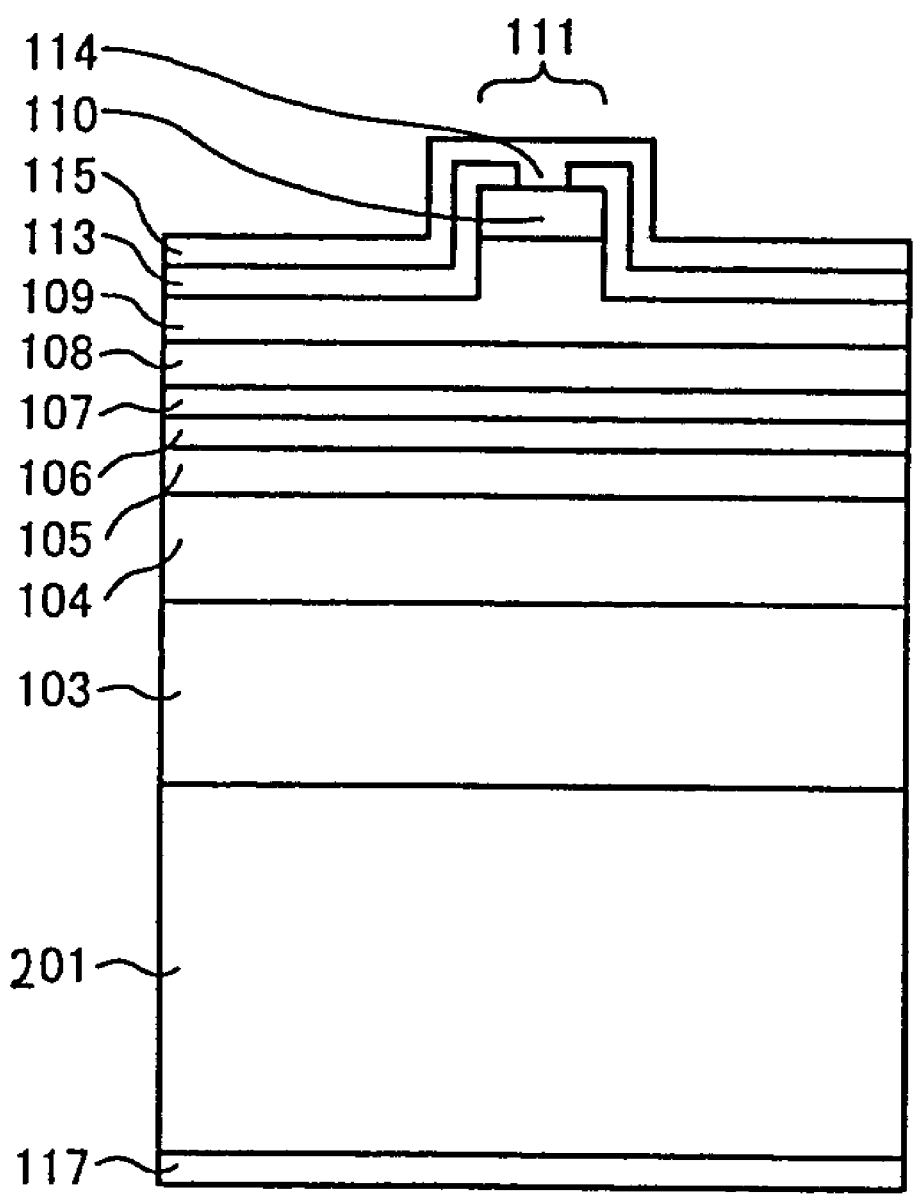
FIG. 21 is a schematic cross sectional view corresponding to the GaN-based semiconductor laser device of FIG. 19.

FIGS. 19, 20 and 21 similar to FIGS. 13, 14 and 15 respectively, schematically illustrate a GaN-based laser device 900 according to the ninth embodiment.

A first point of difference of the ninth embodiment from the sixth through eighth embodiments is that an n-type conductive GaN substrate 201 having a (0001) plane as its main surface is employed as the substrate of the GaN-based semiconductor laser. Further, the buffer layer is omitted.

A second point of difference of the ninth embodiment from the sixth through eighth embodiments is that n-side electrode 117 is formed on the back surface of n-type GaN substrate 201. N-side electrode 117 may be formed after p-side electrode 115 is formed and the total wafer thickness is adjusted to 50–160 µm. As seen from FIG. 19, the current required for the lasing operation is introduced between the top surface side and the bottom surface side of the laser device.

A third point of difference of the ninth embodiment from the sixth through eighth embodiments is that ridge stripe 111 is formed with a width W0=3 µm, and current-introducing window portion 114 is formed with a wide portion having a width W1=2.2 µm and two narrow portions each having a width W2=1.8 µm.

A fourth point of difference of the ninth embodiment from the sixth through eighth embodiments is that the length L1 of the narrow portion of current-introducing window portion 114 is set to 20 µm, and the length L2 of the transition portion from the wide portion to the narrow portion is set to 80 µm. In the ninth embodiment, the positions where the narrow portions of current-introducing window portion 114 are placed are similar to those in the seventh embodiment.

A fifth point of difference of the ninth embodiment from the sixth through eighth embodiments is that the cavity formed by cleavage has a length of 500 µm.

With the GaN-based laser device of the ninth embodiment as described above, it is possible to obtain lasing of the lateral transverse mode, similarly as in the sixth embodiment. Further, since current-introducing window portion 114 is provided on ridge stripe 111 and n-type GaN substrate 201 is used, the current path becomes symmetric with respect to the lateral direction of the ridge stripe, so that the kink level can be increased by about 15 mW compared to the conventional case. The yield of the laser devices suffering no kinks up to the output of 40 mW can further be increased compared to the case of the sixth embodiment. For the threshold voltage of the GaN-based laser of the ninth embodiment, the effect similar to that of the sixth embodiment is obtained. Further, for the far field pattern (FFP) in the lateral direction of the emitted laser light, the similar effect to that of the seventh embodiment is obtained.

Tenth Embodiment

Figure 22:
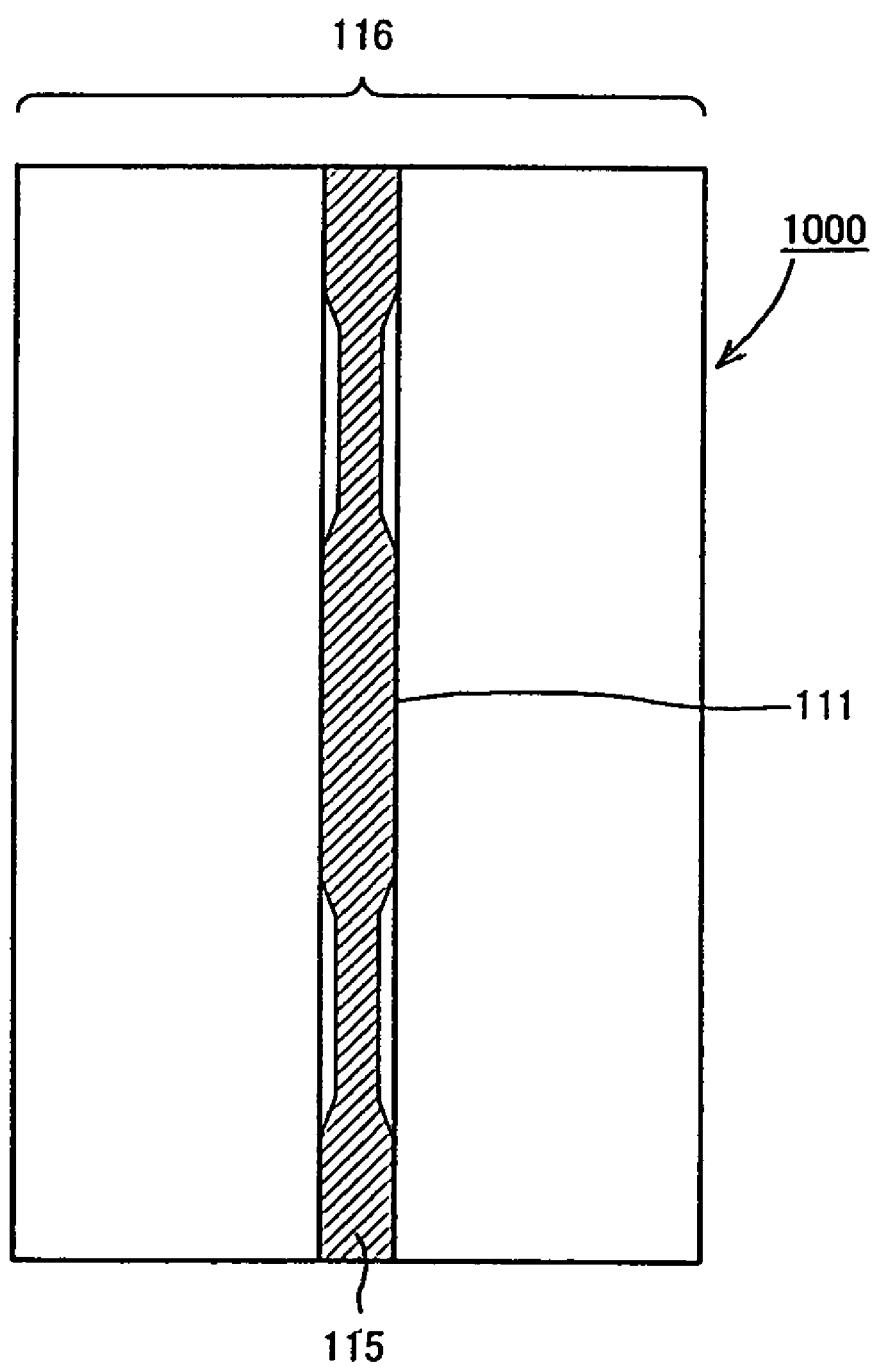
FIG. 22 is a schematic plan view of a GaN-based semiconductor laser device according to a tenth embodiment of the present invention.

FIG. 22 similar to FIG. 14, schematically illustrates a GaN-based semiconductor laser 1000 according to the tenth embodiment. FIGS. 13 and 15 may be referred to as a perspective view and a cross sectional view, respectively, of GaN-based laser device 1000, though reference numerals 101 in FIGS. 13 and 15 should be read as 401 in that case.

A first point of difference of the tenth embodiment from the sixth through ninth embodiments is that a sapphire substrate 401 of a 400 µm thickness having a (0001) plane as its main surface is employed. Accordingly, the longitudinal direction of ridge stripe 111 is formed parallel to the <11–20> direction or the <1–100> direction of the sapphire substrate.

A second point of difference of the tenth embodiment from the sixth through ninth embodiments is that ridge stripe 111 is formed with a width W0=2.0 µm, and current-introducing window portion 114 is formed including wide portions of a width W1=2.0 µm and narrow portions of a width W2=1.5 µm.

A third point of difference of the tenth embodiment from the sixth through ninth embodiments is that the length L1 of each narrow portion of current-introducing window portion 114 is set to 80 µm and the length L2 of the transition portion from the wide portion to the narrow portion is set to 20 µm. The number of the narrow portions is set to 2.

A fourth point of difference of the tenth embodiment from the sixth through ninth embodiments is that the laser device is formed in a different manner. Firstly, in forming p-side electrode portion 115, a first resist pattern having wide portions of a width W1=2.0 µm and narrow portions of a width W2=1.5 µm is formed in the <1–100> or <11–20> direction of the sapphire substrate, and $SiO_2$ is deposited to form dielectric film 113 for constricting the current. Thereafter, a second resist pattern having a uniform width of 2.0 µm is formed to lie on and in alignment with the first resist pattern. Following acid treatment to remove a prescribed portion of dielectric film 113, dry etching is conducted to form ridge stripe portion 111 of a width of 2 µm. Subsequently, after dielectric film 113 is deposited again to prevent leakage of the current, the first and second resist patterns covering ridge stripe 111 are removed, and then p-side electrode 115 is formed. Regarding the other points than those mentioned above, the fabrication method of the present embodiment is similar to that of the sixth embodiment.

With GaN-based laser device 1000 of the tenth embodiment as described above, it is possible to obtain lasing of the lateral transverse mode similar to that in the sixth embodiment. The kink level of GaN-based laser device 1000 is similar to that of the sixth embodiment, and the yield of the devices suffering no kinks up to 40 mW is more than about 80%, similarly as in the case of the sixth embodiment. The threshold voltage of the device of the tenth embodiment is also similar to that of the sixth embodiment.

Although the embodiments of the present invention have been described specifically, the present invention is not restricted to the above-described embodiments. Rather, various modifications are possible based on the technical ideas of the present invention. For example, although the ridge stripe structure and the buried hetero (BH) structure have been explained as the light waveguide structures of the semiconductor laser devices in the above embodiments, it will be apparent to a person skilled in the art that the present invention is also applicable to the laser devices having a self-aligned structure (SAS), a channeled substrate planer (CSP) structure, and others.

Further, although the GaN substrate, the n-type GaN substrate and the sapphire substrate have been described as the substrates of the GaN-based semiconductor laser devices in the above embodiments, it is possible to use a spinel substrate, a SiC substrate, a ZnO substrate, a GaP substrate and others. It is also possible to use a substrate having a GaN-based semiconductor underlayer grown on the above-described substrate, or a GaN-based semiconductor thick film substrate obtained by growing a GaN-based semiconductor thick film on the above-described substrate and removing the substrate. It is further possible to use a GaN-based semiconductor substrate including an additional element(s) other than Ga and N.

Still further, although $SiO_2$ has been described as the material for the dielectric film in the above embodiments, $TiO_2$, zirconia, $Ta_2O_5$, or $Al_2O_3$ may also be employed. Alternatively, the dielectric film may be replaced with a semiconductor layer of a conductivity type opposite to that of the GaN-based semiconductor coming into contact with the dielectric film.

Still further, it is of course possible to reverse the conductivity types of the respective semiconductor layers forming the laser structure in each of the above embodiments.

INDUSTRIAL APPLICABILITY

As described above, a GaN-based semiconductor laser device according to an aspect of the present invention includes light-absorbing films provided in local regions in the vicinity of a stripe-shaped waveguide. Thus, it is possible to stabilize the transverse mode of lasing without narrowing the width of the stripe-shaped waveguide. Further, provision of the light-absorbing film regions increases the degree of freedom in designing the stripe-shaped waveguide. In a GaN-based semiconductor laser device according to another aspect of the present invention, a current path to an active layer is provided with a local narrow portion(s), so that the lasing of the transverse mode can be stabilized without narrowing the width of the stripe-shaped waveguide though the narrowed stripe-shaped waveguide causes increase of the operation voltage. According to any aspect of the present invention, it is possible to provide, with a good yield, GaN-based laser devices suitable for application to optical pickups or the like.

The invention claimed is:

1. A GaN-based semiconductor laser device, comprising a nitride semiconductor active layer and a stripe-shaped waveguide for guiding light generated in the active layer, wherein said stripe-shaped waveguide includes a plurality of local regions along its longitudinal direction, and at least one of said plurality of local regions is made to readily absorb the light of higher order modes compared to the other local regions, wherein said local region for readily absorbing said light of higher order modes in said stripe-shaped waveguide is realized by providing at least one pair of light-absorbing films on opposite sides of said stripe-shaped waveguide to reach a distance within 0.3 μm in a horizontal direction from said waveguide, and wherein said light-absorbing film has an absorption coefficient of more than $3\times10^4$ cm$^{-1}$.

2. The GaN-based semiconductor laser device according to claim 1, wherein said stripe-shaped waveguide has a prescribed cavity length, and said at least one pair of light-absorbing films have a total width within ⅓ of said cavity length along said waveguide.

3. The GaN-based semiconductor laser device according to claim 1, wherein said nitride semiconductor active layer contains $In_xGa_{1-x}N$ ($0 \leq x \leq 1$).

4. The GaN-based semiconductor laser device according to claim 1, wherein said nitride semiconductor active layer also contains As or P.

5. The GaN-based semiconductor laser device according to claim 1, wherein a portion in a longitudinal direction of said stripe-shaped waveguide is a loss guide type waveguide, and the remaining portion is an effective refractive index guide type waveguide.

* * * * *